US012527188B2

United States Patent
Kim et al.

(10) Patent No.: US 12,527,188 B2
(45) Date of Patent: Jan. 13, 2026

(54) MANUFACTURING METHOD FOR DISPLAY DEVICE INCLUDING PAD ELECTRODE

(71) Applicant: SAMSUNG DISPLAY CO., LTD., Yongin-si (KR)

(72) Inventors: Sooyoun Kim, Siheung-si (KR); Woo Yong Sung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 56 days.

(21) Appl. No.: 18/665,846

(22) Filed: May 16, 2024

(65) Prior Publication Data

US 2024/0306440 A1    Sep. 12, 2024

Related U.S. Application Data

(62) Division of application No. 17/374,153, filed on Jul. 13, 2021, now Pat. No. 12,029,078.

(30) Foreign Application Priority Data

Nov. 23, 2020    (KR) ........................ 10-2020-0157902

(51) Int. Cl.
*H10K 59/131* (2023.01)
*H10H 29/10* (2025.01)
(Continued)

(52) U.S. Cl.
CPC ........... *H10K 59/131* (2023.02); *H10H 29/10* (2025.01); *H10K 59/124* (2023.02); *H10K 59/873* (2023.02); *H10K 71/00* (2023.02)

(58) Field of Classification Search
CPC .. H10K 59/131; H10K 59/873; H10K 59/124; H10K 71/00; H10H 29/10
(Continued)

(56) References Cited

U.S. PATENT DOCUMENTS 7,247,881 B2 * 7/2007 Lee ...................... H10D 86/441
                                                  438/149
8,120,017 B2 * 2/2012 Lee ...................... H10K 59/131
                                                  257/749
(Continued)

FOREIGN PATENT DOCUMENTS

JP    2005-017926 A2    1/2005
KR    10-2014-0073829    6/2014
(Continued)

OTHER PUBLICATIONS

Office Action dated Jan. 28, 2025 for corresponding Japanese Patent Application No. 2021-087245, In Japanese (3 pages).
(Continued)

*Primary Examiner* — Eric W Jones
(74) *Attorney, Agent, or Firm* — F. CHAU & ASSOCIATES, LLC

(57) ABSTRACT

A display device according to an embodiment of the present invention may include a substrate including a display area and a pad area located on one side of the display area, a pad electrode disposed in the pad area on the substrate, a protective insulating layer disposed on the substrate and the pad electrode to expose at least a part of a top surface of the pad electrode, an inorganic encapsulation layer disposed on the protective insulating layer, and a conductive layer disposed in the pad area between an end of the inorganic encapsulation layer adjacent to the pad electrode and the protective insulating layer.

11 Claims, 13 Drawing Sheets

(51) Int. Cl.
　　　*H10K 59/124*　　(2023.01)
　　　*H10K 59/80*　　　(2023.01)
　　　*H10K 71/00*　　　(2023.01)

(58) Field of Classification Search
　　　USPC .................................. 257/40, 59, 91, 99, 100
　　　See application file for complete search history.

(56) References Cited

U.S. PATENT DOCUMENTS

| | | | | |
|---|---|---|---|---|
| 10,872,944 | B2* | 12/2020 | Kim | ............... H10K 59/124 |
| 11,678,528 | B2* | 6/2023 | Kim | ............... H10K 59/123 |
| | | | | 257/72 |
| 2015/0076476 | A1 | 3/2015 | Odaka et al. | |
| 2015/0185887 | A1 | 7/2015 | Park et al. | |
| 2016/0013438 | A1 | 1/2016 | Im et al. | |
| 2016/0141549 | A1 | 5/2016 | Odaka et al. | |
| 2018/0151850 | A1 | 5/2018 | Lee | |
| 2018/0351126 | A1 | 12/2018 | Choi | |
| 2020/0168684 | A1* | 5/2020 | Kim | ............... H10K 59/124 |
| 2021/0135159 | A1 | 5/2021 | Senoo et al. | |
| 2021/0376290 | A1 | 12/2021 | Zhang et al. | |
| 2022/0165820 | A1 | 5/2022 | Kim et al. | |

FOREIGN PATENT DOCUMENTS

| | | |
|---|---|---|
| KR | 10-2016-0136492 | 11/2016 |
| KR | 10-1739291 | 5/2017 |
| KR | 10-2018-0133017 A | 12/2018 |
| KR | 10-2032748 | 10/2019 |
| KR | 10-2094143 | 3/2020 |

OTHER PUBLICATIONS

Office Action dated Jul. 23, 2025 in corresponding Korean Patent Application No. 10-2020-0157902, (in Korean), 5 pages.

Office Action dated Jul. 23, 2025 in corresponding Korean Patent Application No. 10-2020-0157902, (English Translation), 6 pages.

* cited by examiner

MANUFACTURING METHOD FOR DISPLAY DEVICE INCLUDING PAD ELECTRODE

CROSS-REFERENCE TO RELATED APPLICATION(S)

This application is a divisional application of U.S. patent application Ser. No. 17/374,153, filed on Jul. 13, 2021, which claims priority under 35 U.S.C. § 119 to Korean Patent Application No. 10-2020-0157902, filed on Nov. 23, 2020, in the Korean Intellectual Property Office, the disclosures of which are incorporated by reference herein in their entirety.

TECHNICAL FIELD

Embodiments of the present invention relate to a display device, and more particularly, relate to a display device including a pad electrode and a method of manufacturing the display device.

DISCUSSION OF RELATED ART

Flat panel display devices are used as display devices for replacing a cathode ray tube display device due to lightweight and thin characteristics thereof, and may include, for example, a liquid crystal display device, an organic light emitting diode display device, a quantum dot light emitting diode display device, etc.

The display device may include a display area in which a pixel structure is disposed and a pad area in which a pad electrode is disposed. The pad electrode may be electrically connected to an external device configured to generate image signals provided to the pixel structure. In the display area, an encapsulation layer configured to protect the pixel structure may be disposed on the pixel structure. In the pad area, to deposit the encapsulation layer such that the encapsulation layer does not overlap the pad electrode, a deposition process using a mask structure may be required, and as a result, an increase in process cost may occur.

SUMMARY

One aspect of the present invention is to provide a display device with enhanced reliability.

Another aspect of the present invention is to provide a method of manufacturing a display device, capable of reducing process cost.

Additional features of the present invention will be set forth in the description which follows, and in part will be apparent from the description, or may be learned by practice of the present invention.

A display device according to an embodiment of the present invention may include a substrate including a display area and a pad area located on one side of the display area, a pad electrode disposed in the pad area on the substrate, a protective insulating layer disposed on the substrate and the pad electrode to expose at least a part of a top surface of the pad electrode, an inorganic encapsulation layer disposed on the protective insulating layer, and a conductive layer disposed in the pad area between an end of the inorganic encapsulation layer adjacent to the pad electrode and the protective insulating layer.

In an embodiment of the present invention, each of the inorganic encapsulation layer and the conductive layer may be spaced apart from at least a part of the pad electrode when viewed in a plan view.

In an embodiment of the present invention, the conductive layer may have an undercut shape in association with the end of the inorganic encapsulation layer.

In an embodiment of the present invention, the conductive layer may have a first etching rate for a first etching process. The first etching process may be used in removing a part of the inorganic encapsulation layer overlapping at least a part of the pad electrode. The inorganic encapsulation layer may have a second etching rate, which is higher than the first etching rate, for the first etching process.

In an embodiment of the present invention, the first etching process may include a dry etching process.

In an embodiment of the present invention, the conductive layer may have a third etching rate for a second etching process. The second etching process may be used in removing a part of the conductive layer overlapping at least a part of the pad electrode. The pad electrode may have a fourth etching rate, which is lower than the third etching rate, for the second etching process.

In an embodiment of the present invention, the protective insulating layer may have a fifth etching rate, which is lower than the third etching rate, for the second etching process.

In an embodiment of the present invention, the inorganic encapsulation layer may have a sixth etching rate, which is lower than the third etching rate, for the second etching process.

In an embodiment of the present invention, the second etching process may include a wet etching process.

In an embodiment of the present invention, the display device may further include a transistor disposed in the display area on the substrate and a pixel electrode disposed on the transistor and electrically connected to the transistor. The conductive layer may be disposed on a layer the same as that of the pixel electrode.

In an embodiment of the present invention, the conductive layer may include a material the same as that of the pixel electrode.

A method of manufacturing a display device according to an embodiment of the present invention may include preparing a substrate including a display area and a pad area located on one side of the display area, forming a pad electrode in the pad area on the substrate, forming a protective insulating layer on the substrate and the pad electrode, forming a contact hole, which exposes at least a part of a top surface of the pad electrode, in the protective insulating layer, forming a conductive layer, which covers the contact hole, in the pad area on the pad electrode and the protective insulating layer, forming an inorganic encapsulation layer on the protective insulating layer and the conductive layer, removing a part of the inorganic encapsulation layer overlapping at least a part of the pad electrode through a first etching process, and removing a part of the conductive layer overlapping at least a part of the pad electrode through a second etching process.

In an embodiment of the present invention, the conductive layer may be formed to cover a part of the protective insulating layer located in the pad area.

In an embodiment of the present invention, during the forming of the inorganic encapsulation layer on the protective insulating layer and the conductive layer, the inorganic encapsulation layer may be formed over the whole of the display area and the pad area on the protective insulating layer and the conductive layer.

In an embodiment of the present invention, the first etching process may be performed without using a mask structure.

In an embodiment of the present invention, the first etching process may include a dry etching process. The second etching process may include a wet etching process.

In an embodiment of the present invention, the conductive layer may have a first etching rate for the first etching process. The inorganic encapsulation layer may have a second etching rate, which is higher than the first etching rate, for the first etching process.

In an embodiment of the present invention, the conductive layer may have a third etching rate for the second etching process. The pad electrode may have a fourth etching rate, which is lower than the third etching rate, for the second etching process.

In an embodiment of the present invention, the protective insulating layer may have a fifth etching rate, which is lower than the third etching rate, for the second etching process.

In an embodiment of the present invention, the inorganic encapsulation layer may have a sixth etching rate, which is lower than the third etching rate, for the second etching process.

In an embodiment of the present invention, the method of manufacturing the display device may further include forming a transistor in the display area on the substrate before the protective insulating layer is formed and forming a pixel electrode on the transistor and electrically connected to the transistor after the protective insulating layer is formed. The pixel electrode may be formed in a process the same as that of the conductive layer.

A method of manufacturing a display device according to an embodiment of the present invention may include preparing a substrate including a display area and a pad area located on one side of the display area, forming a transistor in the display area on the substrate, and a pad electrode in the pad area on the substrate, forming a protective insulating layer on the transistor and the pad electrode, forming a first contact hole, which exposes at least a part of a top surface of a drain electrode of the transistor, and a second contact hole, which exposes at least a part of a top surface of the pad electrode, in the protective insulating layer, forming a pixel electrode on the transistor and connected to the transistor through the first contact hole in the display area, and a conductive layer, which covers the second contact hole, in the pad area on the pad electrode and the protective insulating layer, forming a light emitting element including the pixel electrode, a light emitting layer and a counter electrode sequentially stacked in the display area, forming an inorganic encapsulation layer on the light emitting element and the conductive layer, removing a part of the inorganic encapsulation layer overlapping at least a part of the pad electrode with a dry etching process using atmospheric-pressure plasma by selectively providing an etching gas to the part of the inorganic encapsulation layer to be removed without a mask, and removing a part of the conductive layer overlapping at least a part of the pad electrode through a wet etching process to form an undercut shape under the inorganic encapsulation layer.

The method of manufacturing the display device according to embodiments of the present invention may be configured such that the conductive layer is formed in the pad area on the pad electrode and the protective insulating layer. In addition, inorganic encapsulation layers may be deposited over the whole of the display area and the pad area without using a mask structure. Subsequently, parts of the inorganic encapsulation layers overlapping the pad electrode may be removed by the first etching process that does not use a mask structure. The conductive layer may not be etched by the first etching process, so that the pad electrode may be prevented from being damaged by the first etching process. In addition, a part of the conductive layer overlapping the pad electrode may be removed by the second etching process that does not use a mask structure. Accordingly, the number of mask structures used in a process of manufacturing the display device is reduced, so that the process cost can be reduced. In addition, the pad electrode is prevented from being damaged, so that the reliability of the display device can be enhanced.

It is to be understood that both the foregoing general description and the following detailed description are exemplary and explanatory and are intended to provide further explanation of the present invention as claimed.

BRIEF DESCRIPTION OF THE DRAWINGS

The accompanying drawings, which are provided to illustrate embodiments of the present invention and together with the description serve to explain the present invention, include.

Figure 1:
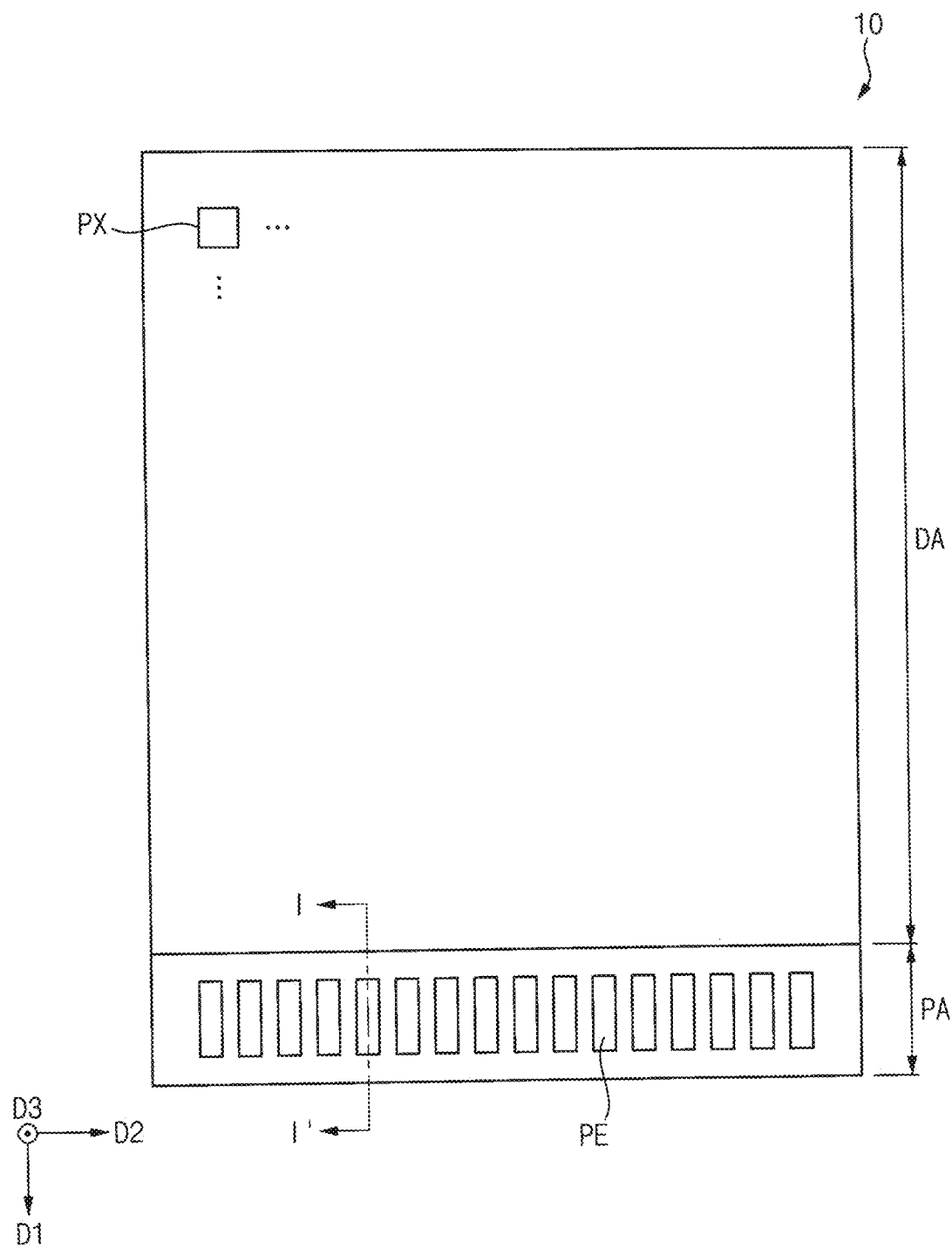
FIG. 1 is a plan view showing a display device according to an embodiment of the present invention.

Since the drawings in FIGS. 1-13 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Illustrative, non-limiting embodiments will be more clearly understood from the following detailed description in conjunction with the accompanying drawings.

Figure 2:
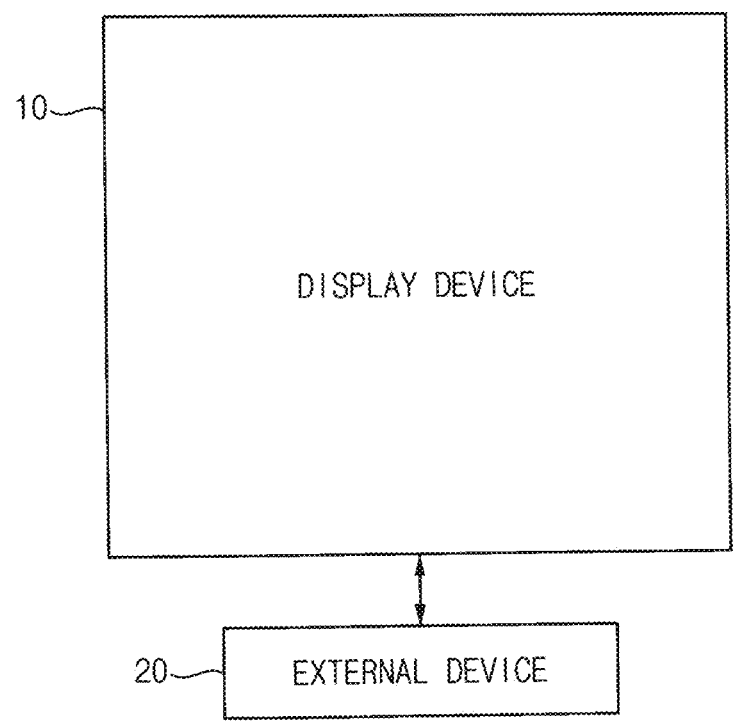
FIG. 2 is a block diagram showing an external device electrically connected to the display device of FIG. 1.

FIG. 1 is a plan view showing a display device according to an embodiment of the present invention, and FIG. 2 is a block diagram showing an external device electrically connected to the display device of FIG. 1.

Referring to FIGS. 1 and 2, a display device 10 (e.g., a substrate 110 of FIG. 3) may include a display area DA and a pad area PA. Pixel structures PX may be disposed in the display area DA. For example, the pixel structures PX may be arranged over the whole display area DA along a first direction D1 and a second direction D2 that is orthogonal to the first direction D1. In an embodiment of the present invention, the pixel structures PX may be arranged in various forms such as, for example, a stripe form, a pentile form, a mosaic form, and the like, to display an image.

Each of the pixel structures PX may include a light emitting element configured to generate light and a transistor configured to drive the light emitting element. For example, the light emitting element may include an organic light emitting diode (OLED), but the present invention is not limited thereto. For example, the light emitting element may include a nano-light emitting diode such as quantum dot light-emitting diode (QLED). For example, the transistor may be a thin film transistor (TFT). An image may be displayed in the display area DA of the display device 10 through the pixel structures PX including the light emitting element and the transistor. In an embodiment of the present invention, for driving the light emitting element, the light emitting element may be connected to a pixel circuit which includes two or more transistors and one or more capacitors.

In an embodiment of the present invention, the pad area PA may be located on at least one side of the display area DA. For example, as shown in FIG. 1, the pad area PA may be located at one side in the first direction D1 from the display area DA. However, since the above configuration has been provided for illustrative purposes, the present invention is not limited thereto. For example, pad areas PA may be located in the first direction D1 and in the second direction D2 from the display area DA, respectively. For example, the pad areas PA may be located at two, three or four sides from the display area DA. In other words, instead of located on bottom side of the display area DA as shown in FIG. 1, the pad areas PA may also be located at the left side, the right side, and/or the top side of the display area DA.

Pad electrodes PE may be disposed in the pad area PA. For example, the pad electrodes PE may be arranged in the second direction D2. The pad electrodes PE may be electrically connected to an external device 20. In other words, the pad electrodes PE may electrically connect the external device 20 to the pixel structures PX.

The external device 20 may be electrically connected to the display device 10 through a flexible printed circuit board or a rigid printed circuit board. For example, one side of the flexible printed circuit board may make direct contact with the pad electrodes PE, and an opposite side of the flexible printed circuit board may make direct contact with the external device 20. At least a part of a top surface of the pad electrode PE may be exposed by a second contact hole 147 (see FIG. 3) to be described, and the pad electrode PE may contact the flexible printed circuit board through the second contact hole 147. The external device 20 may provide a data signal, a gate signal, an emission control signal, a gate initialization signal, an initialization voltage, a power supply voltage, and the like to the display device 10. Accordingly, the external device 20 functioning as a controller may output a signal or a voltage to the display device 10 or receive a signal or a voltage from the display device 10 through the pad electrodes PE and the flexible printed circuit board. In addition, a driving integrated circuit may be mounted on the flexible printed circuit board. In an embodiment of the present invention, the driving integrated circuit may be mounted on the display device 10 adjacent to the pad electrodes PE.

The display area DA may have a rectangular shape, and may have short sides in the second direction D2 and long sides in the first direction D1, or vice versa. Alternatively, the display area DA may have a square shape. The corner where the short side in the second direction D2 meets the long side in the first direction D1 may be formed to have a round shape with a predetermined curvature or have a right-angled shape. Although each of the display area DA and the pad area PA has been shown in the example of FIG. 1 as having a rectangular shape when viewed in a plan view, the present invention is not limited thereto. For example, each of the display area DA and the pad area PA may have, for example, a triangular shape, a rhombic shape, a polygonal shape, a circular shape, or an elliptical shape when viewed in a plan view.

In addition, although a width of the pad area PA in the second direction D2 has been shown in the example of FIG. 1 as being equal to a width of the display area DA in the second direction D2, the present invention is not limited thereto. For example, the width of the pad area PA in the second direction D2 may be less than the width of the display area DA in the second direction D2.

Figure 3:
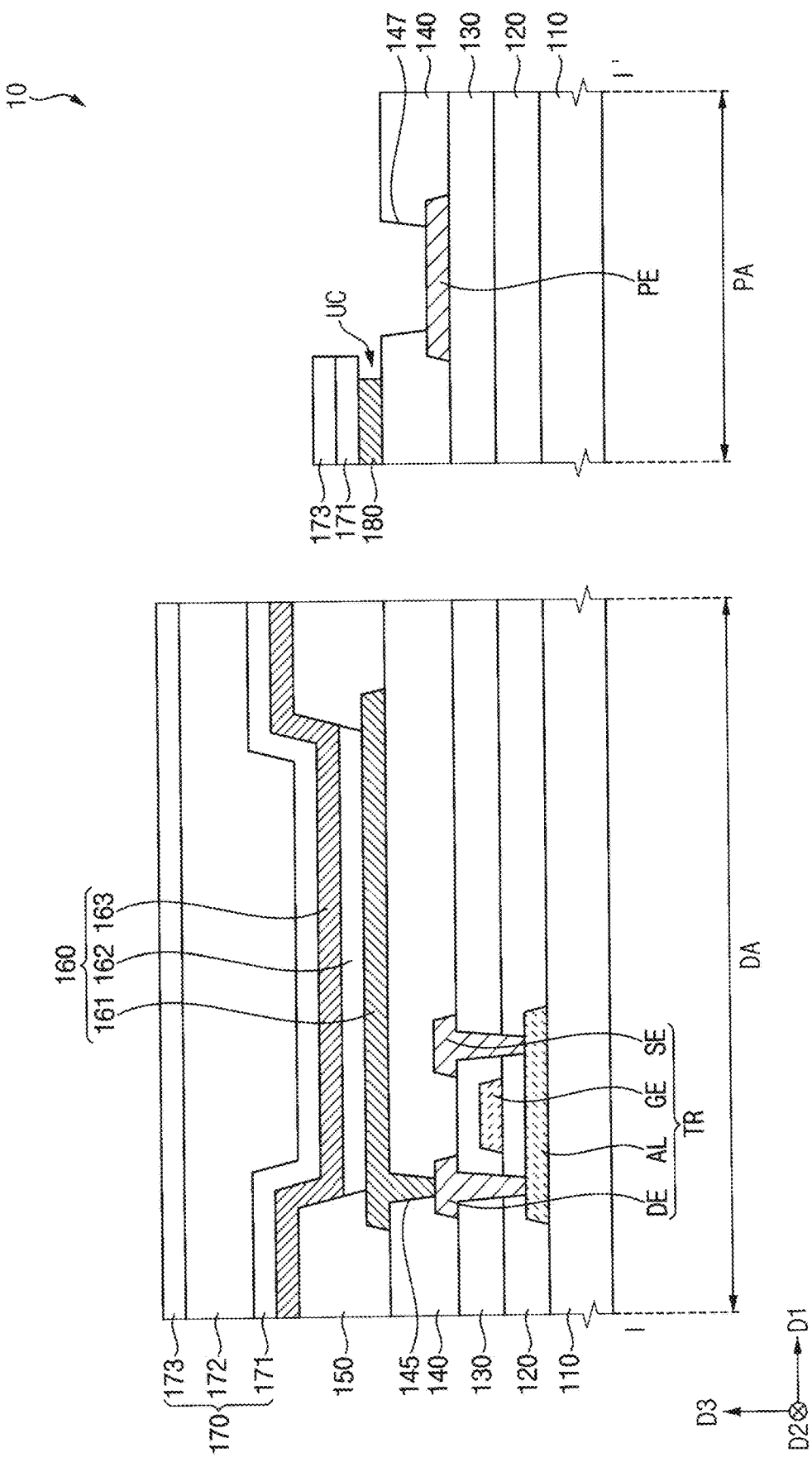
FIG. 3 is a cross-sectional view taken along line I-I' of the display device of FIG. 1.

FIG. 3 is a cross-sectional view taken along line I-I' of the display device of FIG. 1.

Referring to FIG. 3, according to an embodiment of the present invention, the display device 10 may include a substrate 110, a gate insulating layer 120, an interlayer insulating layer 130, a transistor TR, a pad electrode PE, a protective insulating layer 140, a pixel defining layer 150, a light emitting element 160, an encapsulation layer 170, and a conductive layer 180. The transistor TR may include an active layer AL, a gate electrode GE, a source electrode SE, and a drain electrode DE. The light emitting element 160 may include a pixel electrode 161, a light emitting layer 162, and a counter electrode 163. The encapsulation layer 170 may include a first inorganic encapsulation layer 171, an organic encapsulation layer 172, and a second inorganic encapsulation layer 173.

The substrate 110 may include a display area DA and a pad area PA. For example, the pad area PA may be located on one side of the display area DA. In an embodiment of the present invention, the substrate 110 may be a transparent insulating substrate. For example, the substrate 110 may be formed of, for example, glass, quartz, plastic, or the like. According to an embodiment of the present invention, the substrate 110 may include a flexible material. The flexible material may refer to a substrate that is flexible, and is easily bendable, foldable, or rollable. The substrate 110 including such a flexible material may include, for example, ultrathin type glass, or plastic. In an embodiment of the present invention, the plastic material included in the substrate 110 may be polyimide (PI).

The active layer AL may be disposed in the display area DA on the substrate 110. For example, the active layer AL may include, for example, amorphous silicon (a-Si), polycrystalline silicon (p-Si), an oxide semiconductor, and/or the like. The active layer AL may include a source region and a drain region, which are doped with impurities, and a channel region disposed between the source region and the drain region. The source region and the drain region may be doped with P-type or N-type impurities, and the channel region may be doped with impurities having a type different from the type of the impurities of the source region and the drain region. Alternatively, the channel region may not be doped with impurities.

In an embodiment of the present invention, a buffer layer may be disposed between the substrate 110 and the active layer AL. In other words, the active layer AL may be disposed in the display area DA on the buffer layer. The buffer layer may prevent impurities such as, for example, foreign materials, moisture, or external air from diffusing from the substrate 110 to the active layer AL. In addition, the buffer layer may enhance flatness of a surface of the substrate 110 when the surface of the substrate 110 is not uniform. The buffer layer may include an organic material, an inorganic material such as an oxide or a nitride, or an organic/inorganic complex, and may have a single layer or a multilayer structure of an inorganic material and an organic material. For example, the buffer layer may include an inorganic insulating material such as, for example, silicon oxide ($SiO_2$), silicon nitride ($Si_3N_4$), and/or silicon oxynitride (SiON).

The gate insulating layer 120 may be disposed on the substrate 110. For example, the gate insulating layer 120 may be disposed over the whole of the display area DA and the pad area PA on the substrate 110. The gate insulating layer 120 disposed in the display area DA may cover the active layer AL on the substrate 110. For example, the gate insulating layer 120 may include an inorganic insulating material such as, for example, aluminum oxide ($Al_2O_3$), titanium oxide ($TiO_2$), tantalum oxide ($Ta_2O_5$), hafnium oxide ($HfO_2$), lanthanum oxide ($La_2O_3$), zirconium oxide ($ZrO_2$), silicon oxide ($SiO_2$), silicon nitride ($Si_3N_4$), and/or silicon oxynitride (SiON). In an embodiment of the present invention, the gate insulating layer 120 may have a multi-layer structure including a plurality of insulating layers formed of mutually different materials.

The gate electrode GE may be disposed in the display area DA on the gate insulating layer 120, and may overlap the channel region of the active layer AL. The gate electrode GE may include, for example, a metal, an alloy, a conductive metal oxide, a conductive metal nitride, a transparent conductive material, and/or the like. For example, the gate electrode GE may include, for example, aluminum (Al), titanium (Ti), molybdenum (Mo), copper (Cu), and/or the like. The gate electrode G may be arranged on the gate insulating layer 120 to at least partially overlap with the active layer AL. The active layer AL may be electrically insulated from the gate electrode GE by the gate insulating layer 120. In an embodiment of the present invention, the gate electrode GE may have a multilayer structure including a plurality of conductive layers.

The interlayer insulating layer 130 may be disposed on the gate insulating layer 120. For example, the interlayer insulating layer 130 may be disposed over the whole of the display area DA and the pad area PA on the gate insulating layer 120. The interlayer insulating layer 130 disposed in the display area DA may cover the gate electrode GE on the gate insulating layer 120. For example, the interlayer insulating layer 130 may include an inorganic insulating material such as, for example, silicon oxide ($SiO_2$), silicon nitride ($Si_3N_4$), and/or silicon oxynitride (SiON). In an embodiment of the present invention, the interlayer insulating layer 130 may have a multilayer structure including a plurality of insulating layers formed of mutually different materials.

The source electrode SE and the drain electrode DE may be disposed in the display area DA on the interlayer insulating layer 130, and may be connected to the source region and the drain region of the active layer AL, respectively. Each of the source electrode SE and the drain electrode DE may include, for example, a metal, an alloy, a conductive metal oxide, a conductive metal nitride, a transparent conductive material, and/or the like. For example, each of the source electrode SE and the drain electrode DE may include, for example, aluminum (Al), titanium (Ti), copper (Cu), and/or the like. These may be used alone or in combination with each other. In an embodiment of the present invention, each of the source electrode SE and the drain electrode DE may have a multilayer structure including a plurality of conductive layers. For example, each of the source electrode SE and the drain electrode DE may have a multilayer structure, for example, a tri-layer structure of Ti/Al/Ti, in which titanium (Ti), aluminum (Al), and titanium (Ti) are sequentially stacked. The active layer AL, the gate electrode GE, the source electrode SE, and the drain electrode DE may form the transistor TR.

The pad electrode PE may be disposed in the pad area PA on the interlayer insulating layer 130. In other words, the pad electrode PE may be disposed in the pad area PA on the substrate 110. In an embodiment of the present invention, the pad electrode PE may be disposed on a layer substantially the same as that of the source electrode SE and the drain electrode DE. In other words, the pad electrode PE may include a material the same as that of the source electrode SE and the drain electrode DE, and may be formed at a time substantially the same as that of the source electrode SE and the drain electrode DE. For example, the pad electrode PE may be formed in a process the same as that of the source electrode SE and the drain electrode DE. The pad electrode PE may include, for example, a metal, an alloy, a conductive metal oxide, a conductive metal nitride, a transparent conductive material, and/or the like. For example, the pad electrode PE may include, for example, aluminum (Al), titanium (Ti), copper (Cu), and/or the like. These may be used alone or in combination with each other. In an embodiment of the present invention, the pad electrode PE may have a multilayer structure including a plurality of conductive layers. For example, the pad electrode PE may have a multilayer structure, for example, a tri-layer structure of Ti/Al/Ti, in which titanium (Ti), aluminum (Al), and titanium (Ti) are sequentially stacked.

The protective insulating layer 140 may be disposed on the interlayer insulating layer 130. For example, the protective insulating layer 140 may be disposed over the whole of the display area DA and the pad area PA on the interlayer insulating layer 130. The protective insulating layer 140 may protect the transistor TR, and provide a flat surface to an upper portion of the transistor TR. In addition, the protective insulating layer 140 may also be used to cover and protect some wirings on the interlayer insulating layer 130. The protective insulating layer 140 may include an organic material or an inorganic material. For example, the protective insulating layer 140 may include an organic insulating material such as polyimide (PI). In an embodiment of the present invention, the protective insulating layer 140 may have a multilayer structure including a plurality of insulating layers formed of mutually different materials.

The protective insulating layer 140 disposed in the display area DA may have a first contact hole 145 that exposes at least a part of a top surface of the drain electrode DE. The pixel electrode 161 may be electrically connected to the drain electrode DE through the first contact hole 145. For example, the protective insulating layer 140 disposed in the pad area PA may have a second contact hole 147 that exposes at least a part of a top surface of the pad electrode PE. In other words, the protective insulating layer 140 disposed in the pad area PA on the substrate 110 and the pad electrode PE may expose at least a part of the top surface of the pad electrode PE. The external device 20 may be electrically connected to the pad electrode PE through the second contact hole 147. For example, the pad electrode PE may directly contact one side of the flexible printed circuit board through the second contact hole 147, and an opposite side of the flexible printed circuit board may directly contact the external device 20.

The pixel electrode 161 may be disposed in the display area DA on the protective insulating layer 140. The pixel electrode 161 may be disposed on the transistor TR, and may be electrically connected to the transistor TR. For example, the pixel electrode 161 may be electrically connected to the drain electrode DE of the transistor TR through the first contact hole 145. The pixel electrode 161 may be a (semi-)transmissive electrode or a reflective electrode, and may include, for example, a metal, an alloy, a conductive metal oxide, a conductive metal nitride, a transparent conductive material, and/or the like. For example, the pixel electrode 161 may include, for example, silver (Ag), indium tin oxide (ITO), and/or the like. These may be used alone or in combination with each other. In an embodiment of the present invention, the pixel electrode 161 may have a multilayer structure including a plurality of conductive layers. For example, the pixel electrode 161 may have a multilayer structure, for example, a tri-layer structure of ITO/Ag/ITO, in which indium tin oxide (ITO), silver (Ag), and indium tin oxide (ITO) are sequentially stacked.

Figure 10:
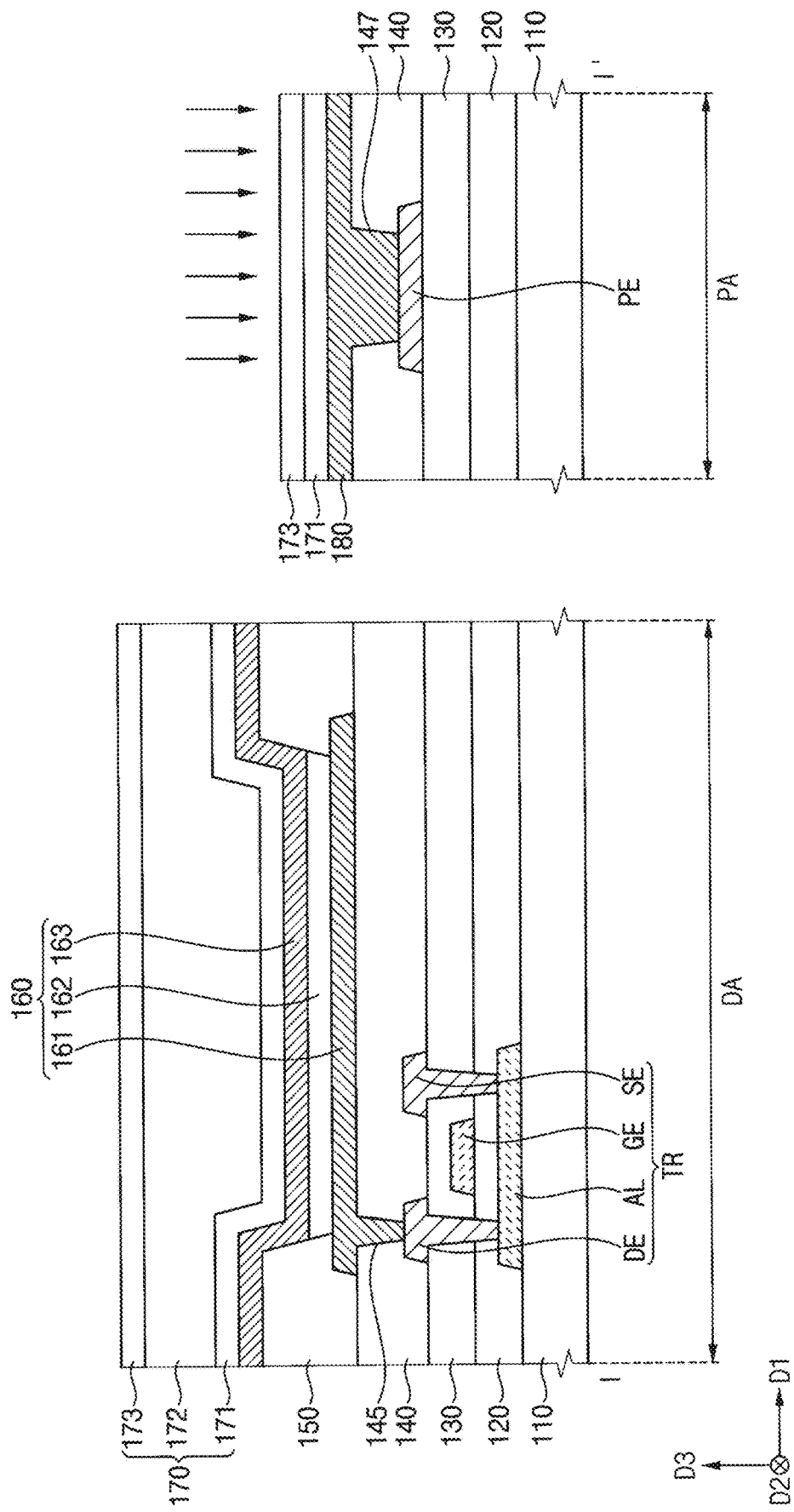
Figure 11:
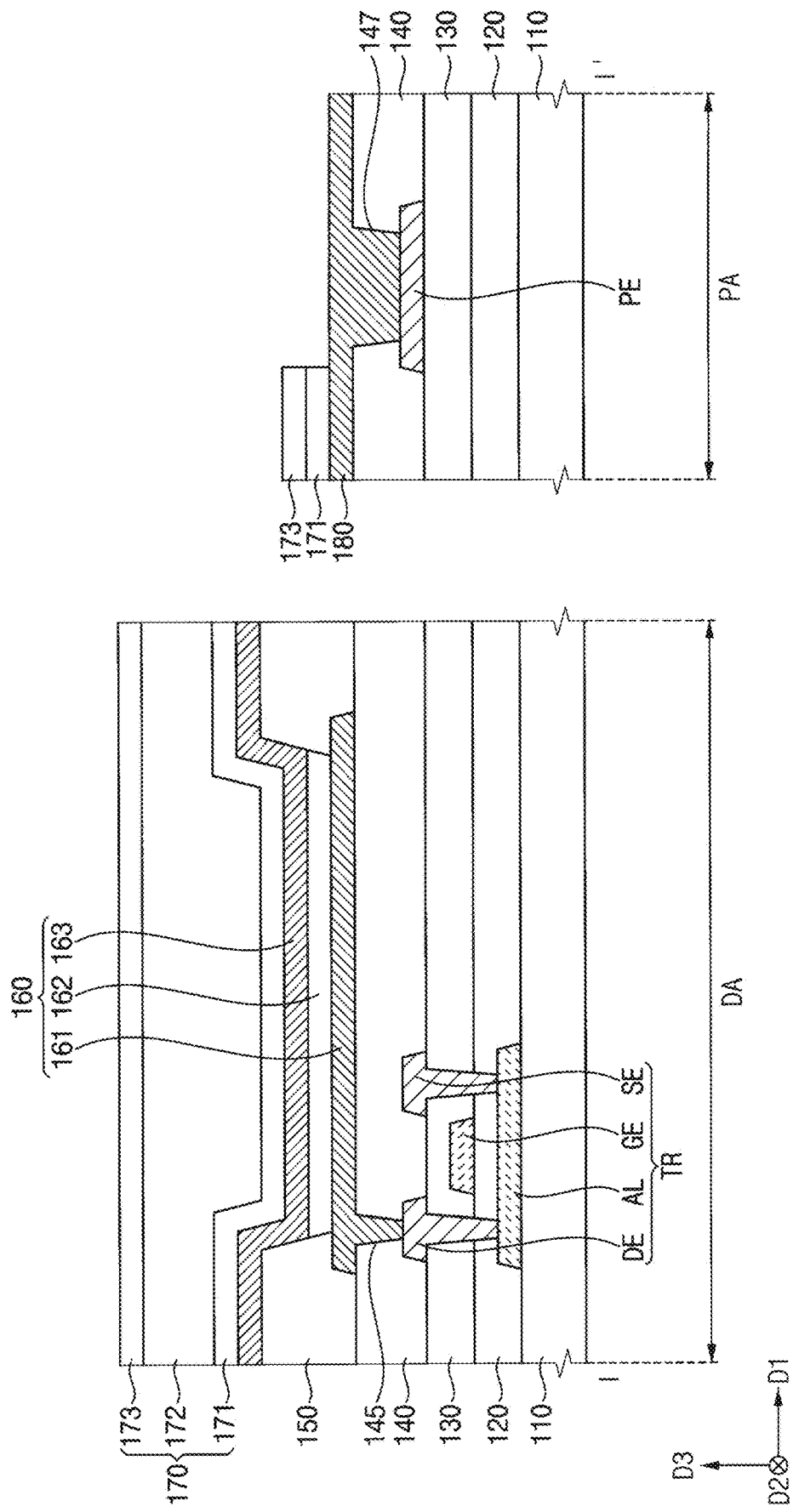

The conductive layer 180 may be disposed in the pad area PA on the protective insulating layer 140. In an embodiment of the present invention, as shown in FIGS. 10 and 11, in a process of manufacturing the display device 10, parts of the first and second inorganic encapsulation layers 171 and 173 overlapping the pad electrode PE may be removed through a first etching process (e.g., a dry etching process using plasma). When the first etching process is performed, the conductive layer 180 may cover the top surface of the pad electrode PE exposed by the second contact hole 147 and a part of the protective insulating layer 140 located in the pad area PA. For example, a first etching rate of the conductive layer 180 for the first etching process may be lower than a second etching rate of the first and second inorganic encapsulation layers 171 and 173 for the first etching process. In other words, in the first etching process, the first and second inorganic encapsulation layers 171 and 173 may be etched relatively more than the conductive layer 180. For example, the first and second inorganic encapsulation layers 171 and 173 may have good etch selectivity with respect to the conductive layer 180 for the first etching process. Thus, the conductive layer 180 may be hardly etched by the first etching process, while the parts of the first and second inorganic encapsulation layers 171 and 173 overlapping the pad electrode PE may be removed by the first etching process. Therefore, the conductive layer 180 may prevent or reduce damage to the pad electrode PE and the protective insulating layer 140 caused by the first etching process. The above configuration will be described in detail below.

Figure 12:
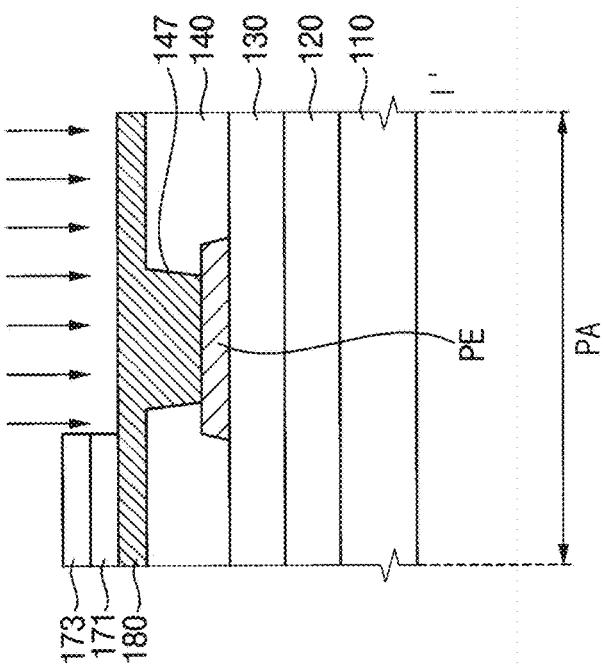
Figure 12:
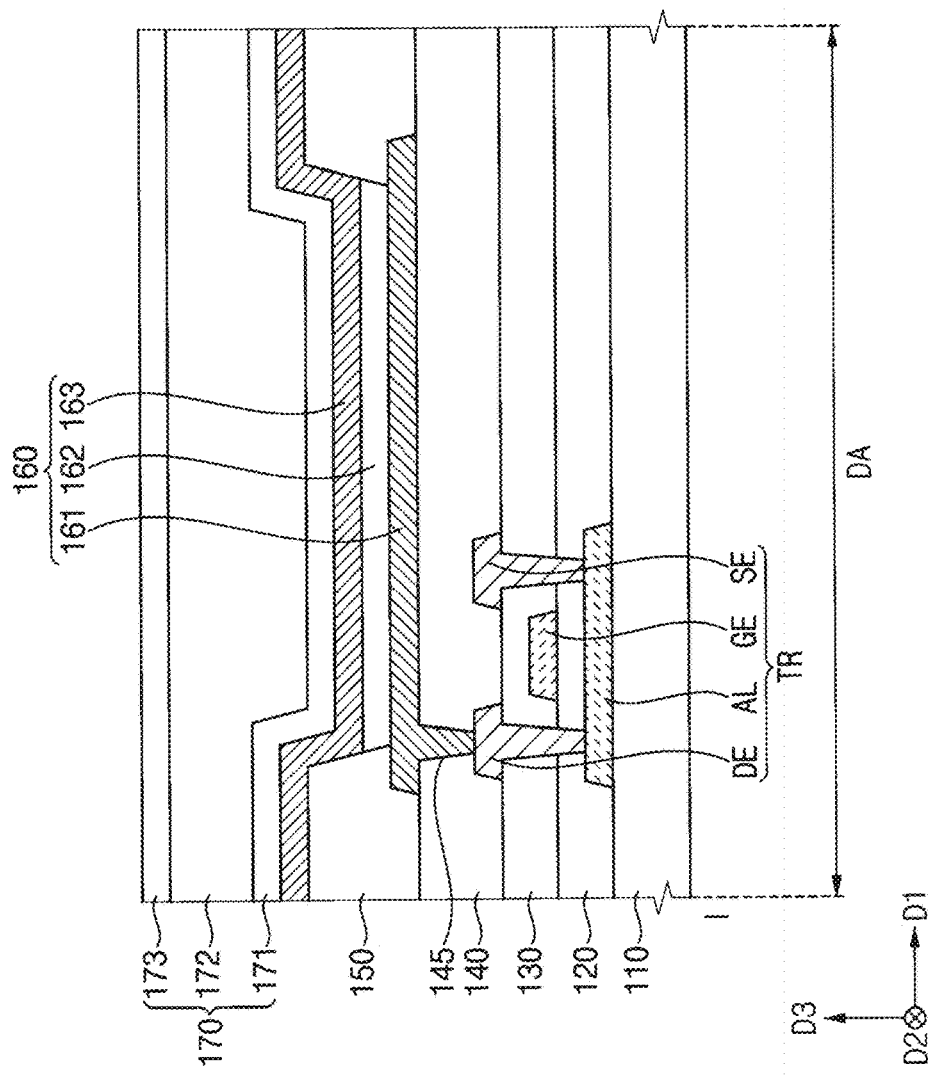
Figure 13:
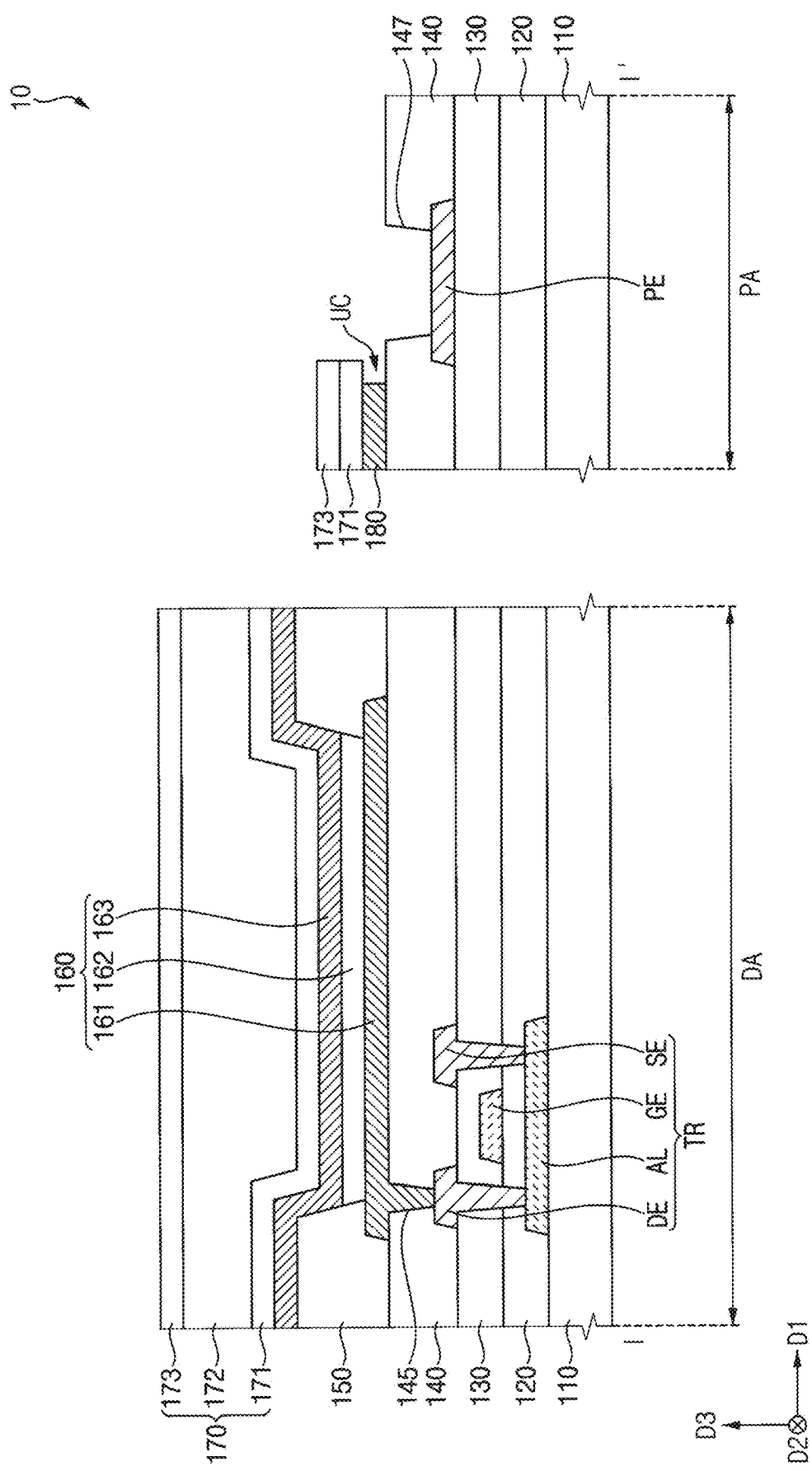

In an embodiment of the present invention, as shown in FIG. 3, the conductive layer 180 may be disposed in the pad area PA between an end of the encapsulation layer 170 adjacent to the pad electrode PE and the protective insulating layer 140. For example, the end of the encapsulation layer 170 may include both an end of the first inorganic encapsulation layer 171 and an end of the second inorganic encapsulation layer 173, which are the ends of the first and second inorganic encapsulation layers 171 and 173 extending from the display area DA, but may not include the organic encapsulation layer 172. For example, the conductive layer 180 may be disposed in the pad area PA between the end of the first inorganic encapsulation layer 171 in the first direction D1 and the protective insulating layer 140. For example, the conductive layer 180 may not make direct contact with the pad electrode PE. For example, the conductive layer 180 may be spaced apart from at least a part of the pad electrode PE when viewed in a plan view. That is, the conductive layer 180 may expose all or a part of the pad electrode PE when viewed in a plan view. In other words, all or a part of the pad electrode PE may not overlap the conductive layer 180 when viewed in a plan view. In an embodiment of the present invention, as shown in FIGS. 12 and 13, in the process of manufacturing the display device 10, after the first etching process is performed, a part of the conductive layer 180 overlapping the pad electrode PE may be removed through a second etching process. Through the second etching process, the conductive layer 180 may expose the top surface of the pad electrode PE exposed by the second contact hole 147. In other words, the portion of the conductive layer 180 covering and filing the second contact hole 147 may be completely removed through the second etching process to expose the pad electrode PE under the second contact hole 147.

In an embodiment of the present invention, the conductive layer 180 may have an undercut (UC) shape in association with the end of the encapsulation layer 170 adjacent to the pad electrode PE. In other words, the conductive layer 180 may have an undercut (UC) shape in association with ends of the first and second inorganic encapsulation layers 171 and 173 in the first direction D1. In other words, the undercut (UC) shape of the conductive layer 180 may be formed with an undercut (UC) region which is a recessed area in the first direction D1 under the ends of the first and second inorganic encapsulation layers 171 and 173, and is located between the protective insulating layer 140 and the ends of the first and second inorganic encapsulation layers 171 and 173. For example, the second etching process may be a wet etching process using an etchant (e.g., an etching solution). In addition, a third etching rate of the conductive layer 180 for the second etching process may be higher than a fourth etching rate of the pad electrode PE for the second etching process, may be higher than a fifth etching rate of the protective insulating layer 140 for the second etching process, and may be higher than a sixth etching rate of the first and second inorganic encapsulation layers 171 and 173 for the second etching process. For example, the conductive layer 180 may have good etch selectivity with respect to the pad electrode PE, the protective insulating layer 140, and the first and second inorganic encapsulation layers 171 and 173 for the first etching process. Therefore, each of the pad electrode PE, the protective insulating layer 140, and the first and second inorganic encapsulation layers 171 and 173 may be hardly etched by the second etching process, while the part of the conductive layer 180 overlapping the pad electrode PE may be removed by the second etching process. In addition, the conductive layer 180 may have the undercut (UC) shape in association with the ends of the first and second inorganic encapsulation layers 171 and 173 in the first direction D1. Since the second etching process is a wet etching process, the conductive layer 180 may be isotropically etched, and may be recessed in the first direction under the first and second inorganic encapsulation layers 171 and 173 to form the undercut (UC) shape by the wet etching process. Although the conductive layer 180 shows a straight sidewall at the undercut (UC) shape as shown in FIG. 3, the present invention is not limited thereto. For example, in an embodiment of the present invention, the undercut (UC) shape may have a convex shape toward the conductive layer 180 in the first direction. The above configuration will be described in detail below.

In an embodiment of the present invention, the conductive layer 180 may be disposed on a layer substantially the same as that of the pixel electrode 161. In other words, the conductive layer 180 may include a material the same as that of the pixel electrode 161, and may be formed at a time substantially the same as that of the pixel electrode 161. For example, the pixel electrode 161 may be formed in a process the same as that of the conductive layer 180. The conductive layer 180 may be a (semi-) transmissive layer or a reflective layer, and may include, for example, a metal, an alloy, a conductive metal oxide, a conductive metal nitride, a transparent conductive material, and/or the like. For example, the conductive layer 180 may include, for example, silver (Ag), indium tin oxide (ITO), and/or the like. These may be used alone or in combination with each other. In an embodiment of the present invention, the conductive layer 180 may have a multilayer structure including a plurality of sub-layers. For example, the conductive layer 180 may have a multilayer structure, for example, a tri-layer structure of ITO/Ag/ITO, in which indium tin oxide (ITO), silver (Ag), and indium tin oxide (ITO) are sequentially stacked.

The pixel defining layer 150 may be disposed in the display area DA on the protective insulating layer 140, and may partially cover the pixel electrode 161 on the protective insulating layer 140. The pixel defining layer 150 may have a pixel opening that exposes at least a part of the pixel electrode 161. For example, the pixel opening may expose a central portion of the pixel electrode 161, and the pixel defining layer 150 may cover a peripheral portion of the pixel electrode 161. The pixel defining layer 150 may prevent generation of arc, and the like between the pixel electrode 161 and the counter electrode 163 at the edge of the pixel electrode 161, by increasing a distance between the edge of the pixel electrode 161 and the counter electrode 163 above the pixel electrode 161. For example, the pixel defining layer 150 may include an organic insulating material such as polyimide (PI).

The light emitting layer 162 may be disposed on the pixel electrode 161 exposed by the pixel opening of the pixel defining layer 150. In other words, the light emitting layer 162 may be disposed in the pixel opening. The light emitting layer 162 may include one or both of an organic light emitting material and a quantum dot. For example, the light emitting layer 162 may include an organic material including a fluorescent or phosphorescent material that emits red, green, blue, or white light. The quantum dot is a particle having a crystal structure of several to tens of nanometers in size, and may include hundreds to thousands of atoms. The quantum dot may include a fluorescent material or a phosphorescent material, and may produce monochromatic red, green, and blue light.

The counter electrode 163 may be disposed on the light emitting layer 162, and may overlap the pixel electrode 161. In an embodiment of the present invention, the counter electrode 163 may be disposed on the pixel defining layer 150. The counter electrode 163 may be a transmissive electrode or a reflective electrode, and may include, for example, a metal, an alloy, a conductive metal oxide, a conductive metal nitride, a transparent conductive material, and/or the like. For example, the counter electrode 163 may include, for example, aluminum (Al), platinum (Pt), silver (Ag), magnesium (Mg), gold (Au), chromium (Cr), tungsten (W), titanium (Ti), and/or the like. For example, the counter electrode 163 may include a transparent conductive oxide (TCO) film such as, for example, an indium tin oxide (ITO) film, an indium zinc oxide (IZO) film, a zinc oxide (ZnO) film, or an indium oxide ($In_2O_3$) film. These may be used alone or in combination with each other. The pixel electrode 161, the light emitting layer 162, and the counter electrode 163 may form the light emitting element 160.

The encapsulation layer 170 may be disposed on the counter electrode 163, and may cover the light emitting element 160. The encapsulation layer 170 may seal the display area DA to protect the light emitting element 160 from external impurities.

The encapsulation layer 170 may include at least one inorganic encapsulation layer and at least one organic encapsulation layer. For example, as shown in FIG. 3, the encapsulation layer 170 may include a first inorganic encapsulation layer 171, a second inorganic encapsulation layer 173 disposed over the first inorganic encapsulation layer 171, and an organic encapsulation layer 172 disposed between the first inorganic encapsulation layer 171 and the second inorganic encapsulation layer 173. However, since the above configuration has been provided for illustrative purposes, the present invention is not limited thereto. For example, the number of organic encapsulation layers and the number of inorganic encapsulation layers and an order of stacking organic encapsulation layers and inorganic encapsulation layers may be variously changed.

The first inorganic encapsulation layer 171 may be disposed on the counter electrode 163. For example, the first inorganic encapsulation layer 171 may have a substantially uniform thickness along a profile of the counter electrode 163. As the first inorganic encapsulation layer 171 is formed along a structure thereunder, an upper surface of the first inorganic encapsulation layer 171 may not be flat.

The organic encapsulation layer 172 may be disposed on the first inorganic encapsulation layer 171. The organic encapsulation layer 172 may have a substantially flat top surface without creating a step around the first inorganic encapsulation layer 171.

The second inorganic encapsulation layer 173 may be disposed on the organic encapsulation layer 172. In other words, the first and second inorganic encapsulation layers 171 and 173 may be disposed on the protective insulating layer 140. The second inorganic encapsulation layer 173 may have a substantially uniform thickness, and may have a substantially flat top surface. The first inorganic encapsulation layer 171 and the second inorganic encapsulation layer 173 may protect the light emitting element 160 from moisture/oxygen. The organic encapsulation layer 172 may protect the light emitting element 160 from foreign materials such as dust particles.

In an embodiment of the present invention, as shown in FIG. 3, parts of the first and second inorganic encapsulation layers 171 and 173 may extend from the display area DA to the pad area PA. In the pad area PA, the first and second inorganic encapsulation layers 171 and 173 may be in direct contact with each other without the organic encapsulation layer 172 interposed therebetween. In other words, the end of each of the first and second inorganic encapsulation layers 171 and 173 in the first direction D1 may be located in the pad area PA. For example, each of the first and second inorganic encapsulation layers 171 and 173 may not make direct contact with the pad electrode PE. For example, each of the first and second inorganic encapsulation layers 171 and 173 may be spaced apart from at least a part of the pad electrode PE when viewed in a plan view. That is, each of the first and second inorganic encapsulation layers 171 and 173 may expose all or a part of the pad electrode PE when viewed in a plan view. In other words, all or a part of the pad electrode PE may not overlap each of the first and second inorganic encapsulation layers 171 and 173 when viewed in a plan view. The first inorganic encapsulation layer 171, the second inorganic encapsulation layer 173, and the conductive layer 180 may not cover the second contact hole 147, and may expose the top surface of the pad electrode PE exposed by the second contact hole 147. Therefore, a conductive member (e.g., an anisotropic conductive film, etc.) may make direct contact with the top surface of the pad electrode PE exposed by the second contact hole 147. The pad electrode PE and the external device 20 may be electrically connected to each other through the conductive member.

FIGS. 4 to 13 are cross-sectional views showing a method of manufacturing a display device according to an embodiment of the present invention.

Figure 4:
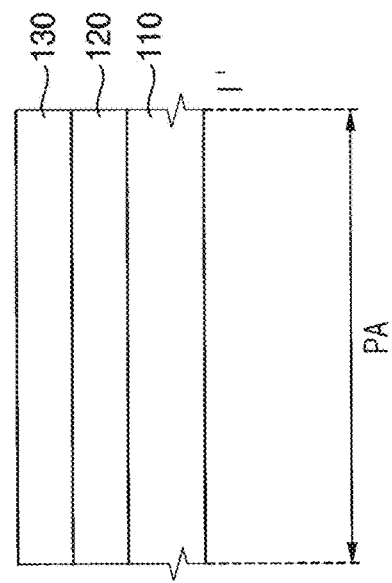
FIGS. 4 to 13 are cross-sectional views showing a method of manufacturing a display device according to an embodiment of the present invention.
Figure 4:
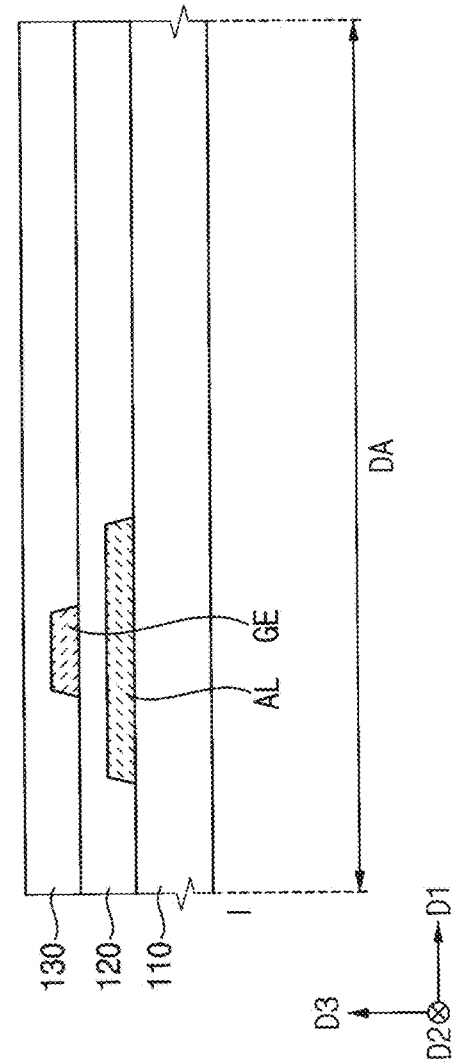

Referring to FIG. 4, the substrate 110 including the display area DA and the pad area PA may be prepared. For example, the pad area PA may be located on one side of the display area DA. In an embodiment of the present invention, the substrate 110 may be a transparent insulating substrate.

For example, the substrate 110 may be formed of, for example, glass, quartz, plastic, or the like. In an embodiment of the present invention, the substrate 110 may include a flexible material which includes, for example, ultrathin type glass, or plastic.

The active layer AL may be formed in the display area DA on the substrate 110. For example, the active layer AL may be formed by using, for example, amorphous silicon (a-Si), polycrystalline silicon (p-Si), an oxide semiconductor, and/or the like. The active layer AL may include the source region, the drain region, and the channel region. The source region and the drain region may be doped with P-type or N-type impurities, and the channel region may be doped with impurities having a type different from the type of the impurities of the source region and the drain region. Alternatively, the channel region may not be doped with impurities.

The gate insulating layer 120 may be formed on the substrate 110 and the active layer AL. For example, the gate insulating layer 120 may be formed over the whole of the display area DA and the pad area PA on the substrate 110. The gate insulating layer 120 formed in the display area DA may cover the active layer AL on the substrate 110. For example, the gate insulating layer 120 may be formed by using an inorganic insulating material such as, for example, aluminum oxide ($Al_2O_3$), titanium oxide ($TiO_2$), tantalum oxide ($Ta_2O_5$), hafnium oxide ($HfO_2$), lanthanum oxide ($La_2O_3$), zirconium oxide ($ZrO_2$), silicon oxide ($SiO_2$), silicon nitride ($Si_3N_4$), and/or silicon oxynitride (SiON).

The gate electrode GE may be formed in the display area DA on the gate insulating layer 120. The gate electrode GE may overlap the channel region of the active layer AL. For example, the gate electrode GE may be formed by using, for example, a metal, an alloy, a conductive metal oxide, a conductive metal nitride, a transparent conductive material, and/or the like. In an embodiment of the present invention, the gate electrode GE may include, for example, aluminum (Al), titanium (Ti), molybdenum (Mo), copper (Cu), and/or the like.

The interlayer insulating layer 130 may be formed on the gate insulating layer 120 and the gate electrode GE. For example, the interlayer insulating layer 130 may be formed over the whole of the display area DA and the pad area PA on the gate insulating layer 120. The interlayer insulating layer 130 formed in the display area DA may cover the gate electrode GE on the gate insulating layer 120. For example, the interlayer insulating layer 130 may be formed by using an inorganic insulating material such as, for example, silicon oxide ($SiO_2$), silicon nitride ($Si_3N_4$), and/or silicon oxynitride (SiON).

Figure 5:
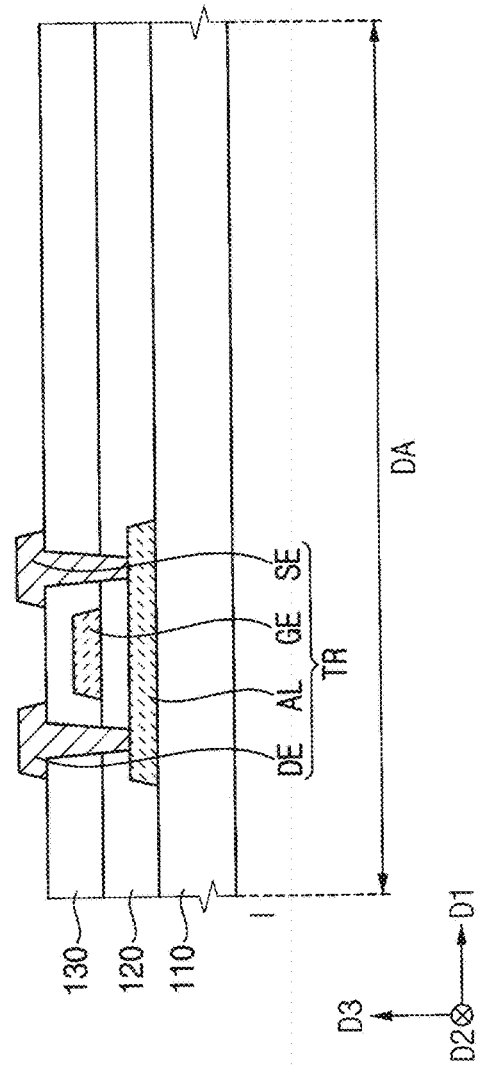

Referring to FIG. 5, contact holes may be formed in the gate insulating layer 120 and the interlayer insulating layer 130 to overlap the source region and the drain region of the active layer AL, respectively. In addition, the source electrode SE and the drain electrode DE may be formed on the interlayer insulating layer 130 to overlap the contact holes, respectively. The source electrode SE and the drain electrode DE may be connected to the source region and the drain region of the active layer AL through the contact holes, respectively. Each of the source electrode SE and the drain electrode DE may include, for example, a metal, an alloy, a conductive metal oxide, a conductive metal nitride, a transparent conductive material, and/or the like. For example, each of the source electrode SE and the drain electrode DE may include, for example, aluminum (Al), titanium (Ti), copper (Cu), and/or the like. The active layer AL, the gate electrode GE, the source electrode SE, and the drain electrode DE may form the transistor TR.

The pad electrode PE may be formed in the pad area PA on the interlayer insulating layer 130. In other words, the pad electrode PE may be formed in the pad area PA on the substrate 110. The pad electrode PE may be formed by using a material having an etching rate that is lower than an etching rate of the conductive layer 180 for the second etching process (e.g., the wet etching process using the etchant). In other words, in the second etching process shown in FIGS. 12 and 13, the conductive layer 180 may be etched relatively more than the pad electrode PE. For example, the conductive layer 180 may have good etch selectivity with respect to the pad electrode PE for the second etching process. Thus, the pad electrode PE may be hardly etched by the second etching process, while the part of the conductive layer 180 overlapping the pad electrode PE may be removed by the second etching process. In an embodiment of the present invention, the pad electrode PE may have a multilayer structure including a plurality of conductive layers. In this case, an uppermost layer among the conductive layers may be formed by using the material having the etching rate that is lower than the etching rate of the conductive layer 180 for the second etching process. Alternatively, each of the conductive layers may be formed by using the material having the etching rate that is lower than the etching rate of the conductive layer 180 for the second etching process.

In an embodiment of the present invention, each of the source electrode SE, the drain electrode DE, and the pad electrode PE may be formed by using, for example, a metal, an alloy, a conductive metal oxide, a conductive metal nitride, a transparent conductive material, and/or the like. For example, each of the source electrode SE, the drain electrode DE, and the pad electrode PE may be formed by using, for example, aluminum (Al), titanium (Ti), copper (Cu), and/or the like. These may be used alone or in combination with each other. In an embodiment of the present invention, each of the source electrode SE, the drain electrode DE, and the pad electrode PE may have a multi-layer structure including a plurality of conductive layers. For example, each of the source electrode SE, the drain electrode DE, and the pad electrode PE may have a multilayer structure, for example, a tri-layer structure of Ti/Al/Ti, in which titanium (Ti), aluminum (Al), and titanium (Ti) are sequentially stacked.

In an embodiment of the present invention, the source electrode SE, the drain electrode DE, and the pad electrode PE may be formed substantially at the same time. For example, a first preliminary electrode layer may be formed over the whole of the display area DA and the pad area PA on the interlayer insulating layer 130. In addition, the source electrode SE, the drain electrode DE, and the pad electrode PE may be simultaneously formed by partially etching the first preliminary electrode layer. For example, a photolithography process and an etching process may be performed on the first preliminary electrode layer to pattern the first preliminary electrode layer, so that the source electrode SE, the drain electrode DE, and the pad electrode PE may be formed at the same time.

Figure 6:
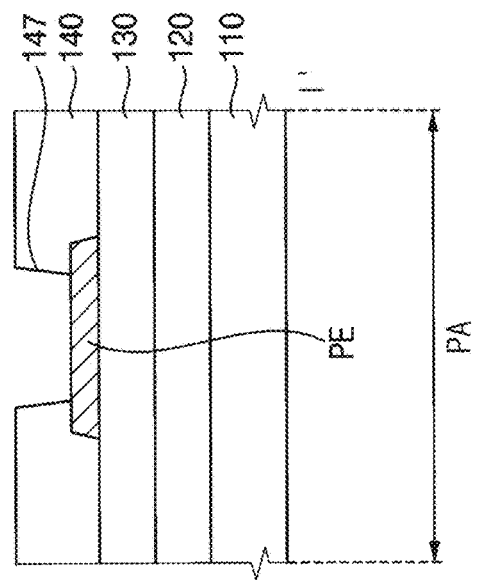
Figure 6:
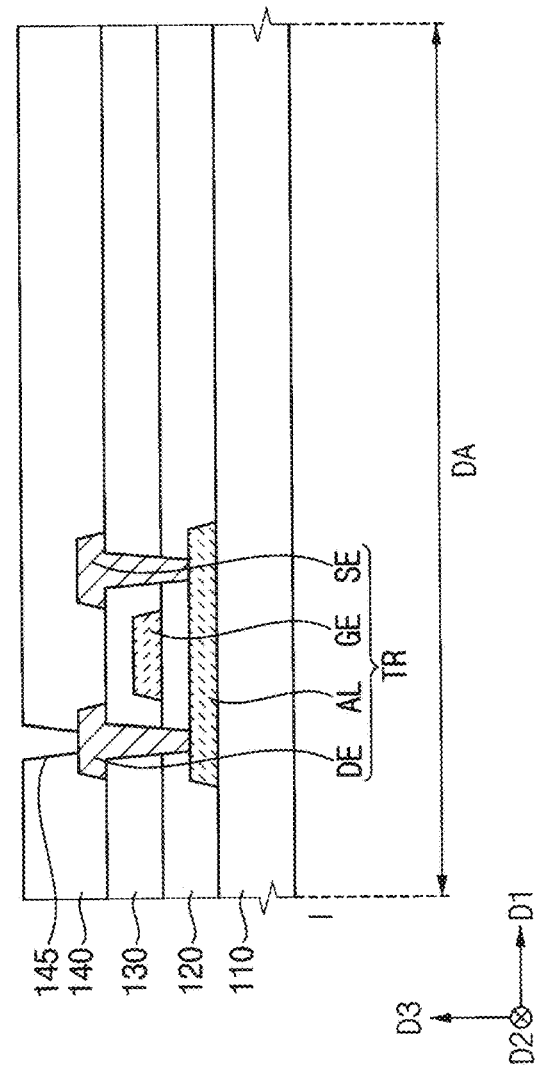

Referring to FIG. 6, the protective insulating layer 140 may be formed on the interlayer insulating layer 130, the source electrode SE, the drain electrode DE, and the pad electrode PE. In other words, the protective insulating layer 140 may be formed on the substrate 110 and the pad electrode PE. For example, the protective insulating layer 140 may be formed over the whole of the display area DA and the pad area PA on the interlayer insulating layer 130. For example, the protective insulating layer 140 may be formed on the transistor TR and the pad electrode PE. The protective insulating layer 140 may be formed by using a material having an etching rate that is lower than the etching rate of the conductive layer 180 for the second etching process (e.g., the wet etching process using the etchant). In other words, in the second etching process shown in FIGS. 12 and 13, the conductive layer 180 may be etched relatively more than the protective insulating layer 140. For example, the conductive layer 180 may have good etch selectivity with respect to the protective insulating layer 140 for the second etching process. Thus, the protective insulating layer 140 may be hardly etched by the second etching process, while the part of the conductive layer 180 overlapping the pad electrode PE may be removed by the second etching process. For example, the protective insulating layer 140 may be formed by using an organic insulating material such as polyimide (PI).

The first contact hole 145 and the second contact hole 147 may be formed in the protective insulating layer 140. The first contact hole 145 may expose at least a part of the top surface of the drain electrode DE of the transistor TR. The second contact hole 147 may expose at least a part of the top surface of the pad electrode PE. The first and second contact holes 145 and 147 may be formed substantially at the same time.

Figure 7:
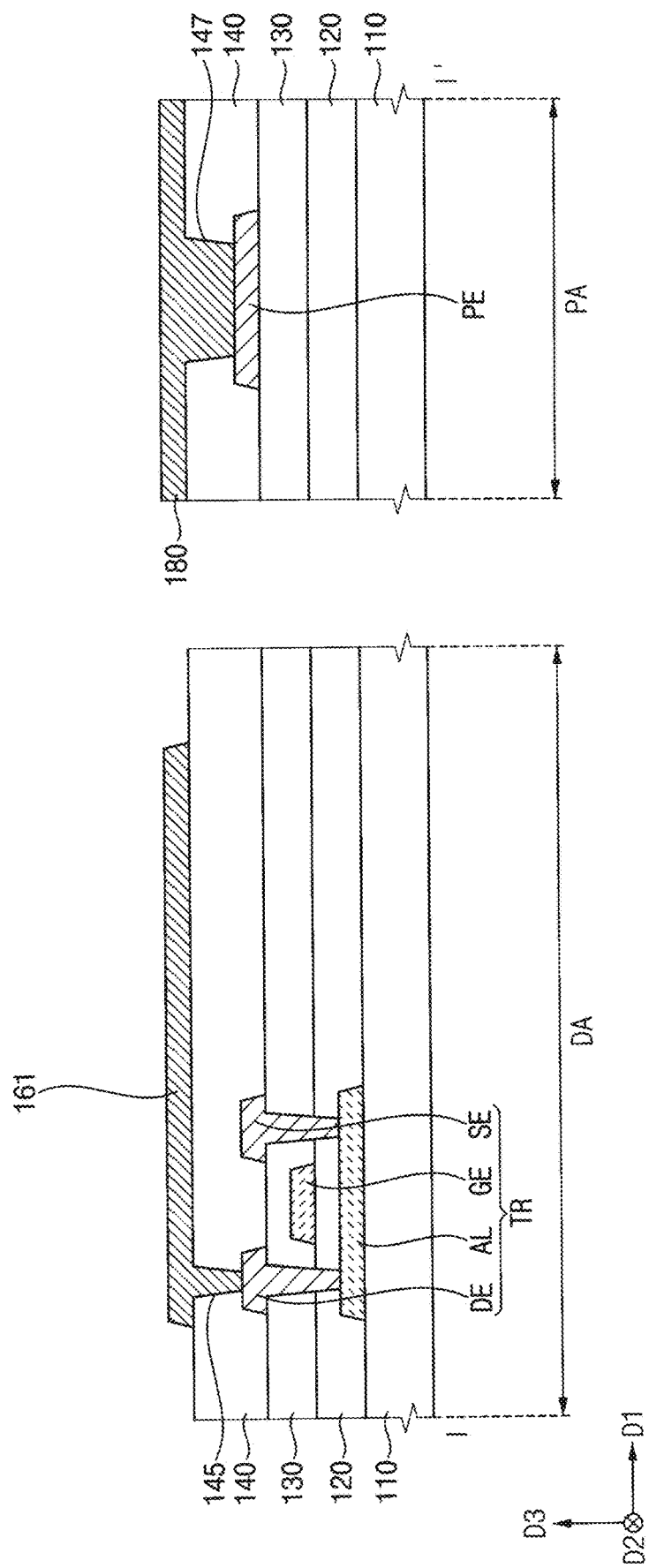

Referring to FIG. 7, the pixel electrode 161 may be formed in the display area DA on the protective insulating layer 140. The pixel electrode 161 may be electrically connected to the drain electrode DE through the first contact hole 145. For example, the pixel electrode 161 may be formed on the transistor TR, and may be connected to the transistor TR through the first contact hole 145 in the display area DA.

The conductive layer 180, which covers the second contact hole 147, may be formed in the pad area PA on the pad electrode PE and the protective insulating layer 140. For example, as shown in FIG. 7, the conductive layer 180 may cover the top surface of the pad electrode PE exposed by the second contact hole 147 and a part of the protective insulating layer 140 located in the pad area PA. In other words, the conductive layer 180 may be formed over the whole pad area PA on the pad electrode PE and the protective insulating layer 140.

The conductive layer 180 may be formed by using a material having an etching rate that is lower than an etching rate of the first and second inorganic encapsulation layers 171 and 173 for the first etching process (e.g., the dry etching process using the plasma). In other words, in the first etching process shown in FIGS. 10 and 11, the first and second inorganic encapsulation layers 171 and 173 may be etched relatively more than the conductive layer 180. For example, the first and second inorganic encapsulation layers 171 and 173 may have good etch selectivity with respect to the conductive layer 180 for the first etching process. Thus, the conductive layer 180 may be hardly etched by the first etching process, while the parts of the first and second inorganic encapsulation layers 171 and 173 overlapping the pad electrode PE may be removed by the first etching process. In an embodiment of the present invention, the conductive layer 180 may have a multilayer structure including a plurality of sub-layers. In this case, an uppermost layer among the sub-layers may be formed by using the material having the etching rate that is lower than the etching rate of the first and second inorganic encapsulation layers 171 and 173 for the first etching process. Alternatively, each of the sub-layers may be formed by using the material having the etching rate that is lower than the etching rate of the first and second inorganic encapsulation layers 171 and 173 for the first etching process.

The conductive layer 180 may be formed by using a material having an etching rate that is higher than each of an etching rate of the pad electrode PE, an etching rate of the protective insulating layer 140, and an etching rate of the first and second inorganic encapsulation layers 171 and 173 for the second etching process (e.g., the wet etching process using the etchant). In other words, in the second etching process shown in FIGS. 12 and 13, the conductive layer 180 may be etched relatively more than the pad electrode PE, the protective insulating layer 140, and the first and second inorganic encapsulation layers 171 and 173. For example, the conductive layer 180 may have good etch selectivity with respect to the pad electrode PE, the protective insulating layer 140, and the first and second inorganic encapsulation layers 171 and 173 for the second etching process. Thus, the pad electrode PE, the protective insulating layer 140, and the first and second inorganic encapsulation layers 171 and 173 may be hardly etched by the second etching process, while the part of the conductive layer 180 overlapping the pad electrode PE may be removed by the second etching process. In an embodiment of the present invention, the conductive layer 180 may have a multilayer structure including a plurality of sub-layers. In this case, each of the sub-layers may be formed by using the material having the etching rate that is higher than each of the etching rate of the pad electrode PE, the etching rate of the protective insulating layer 140, and the etching rate of the first and second inorganic encapsulation layers 171 and 173 for the second etching process.

Each of the pixel electrode 161 and the conductive layer 180 may be formed by using, for example, a metal, an alloy, a conductive metal oxide, a conductive metal nitride, a transparent conductive material, and/or the like. For example, each of the pixel electrode 161 and the conductive layer 180 may include, for example, silver (Ag), indium tin oxide (ITO), and/or the like. These may be used alone or in combination with each other. In an embodiment of the present invention, each of the pixel electrode 161 and the conductive layer 180 may have a multilayer structure including a plurality of conductive layers. For example, each of the pixel electrode 161 and the conductive layer 180 may have a multilayer structure, for example, a tri-layer structure of ITO/Ag/ITO, in which indium tin oxide (ITO), silver (Ag), and indium tin oxide (ITO) are sequentially stacked.

In an embodiment of the present invention, the pixel electrode 161 and the conductive layer 180 may be formed substantially at the same time. For example, a second preliminary electrode layer may be formed over the whole of the display area DA and the pad area PA on the protective insulating layer 140 and the pad electrode PE. In addition, the pixel electrode 161 and the conductive layer 180 may be simultaneously formed by partially etching the second preliminary electrode layer. For example, a photolithography process and an etching process may be performed on the second preliminary electrode layer to pattern the second preliminary electrode layer, so that the pixel electrode 161 and the conductive layer 180 may be formed at the same time.

Figure 8:
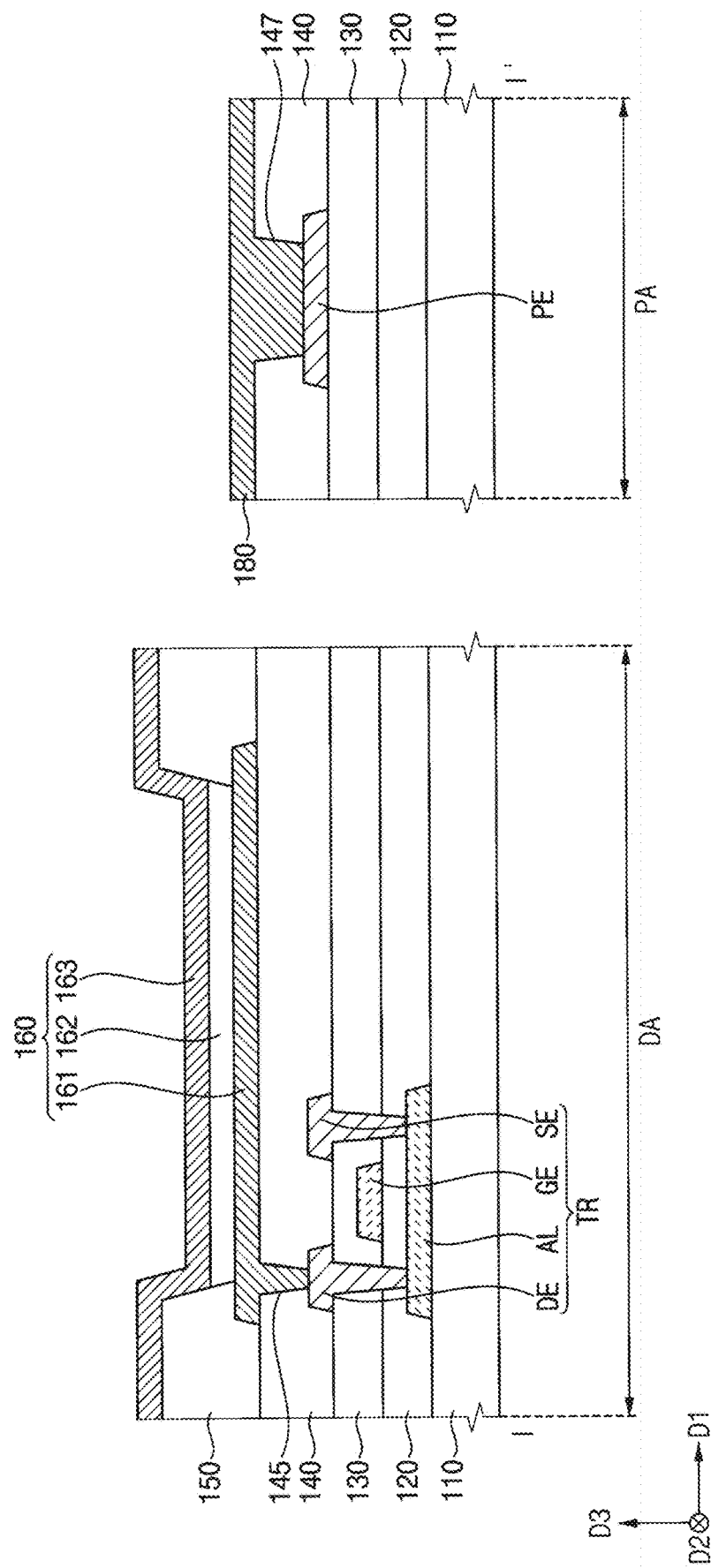

Referring to FIG. 8, the pixel defining layer 150 may be formed in the display area DA on the protective insulating layer 140, and may partially cover the pixel electrode 161 on the protective insulating layer 140. The pixel opening that exposes at least a part of the pixel electrode 161 may be formed in the pixel defining layer 150. For example, the pixel opening may expose a central portion of the pixel electrode 161, and the pixel defining layer 150 may cover a peripheral portion of the pixel electrode 161. For example, the pixel defining layer 150 may be formed by using an organic insulating material such as polyimide (PI).

The light emitting layer 162 may be formed in the display area DA on the pixel electrode 161. For example, the light emitting layer 162 may be formed on the pixel electrode 161 exposed by the pixel opening of the pixel defining layer 150. The light emitting layer 162 may be formed by using one or both of an organic light emitting material and a quantum dot. Functional layers such as a hole transport layer (HTL), a hole injection layer (HIL), an electron transport layer (ETL), an electron injection layer (EIL), and the like may be further optionally formed under and above the light emitting layer 162.

The counter electrode 163 may be formed in the display area DA on the light emitting layer 162. For example, the counter electrode 163 may be formed in the display area DA on the pixel defining layer 150. The counter electrode 163 may be formed by using, for example, a metal, an alloy, a conductive metal oxide, a conductive metal nitride, a transparent conductive material, and/or the like. The pixel electrode 161, the light emitting layer 162, and the counter electrode 163 may form the light emitting element 160. For example, the light emitting element 160 may be formed in the display area DA.

Figure 9:
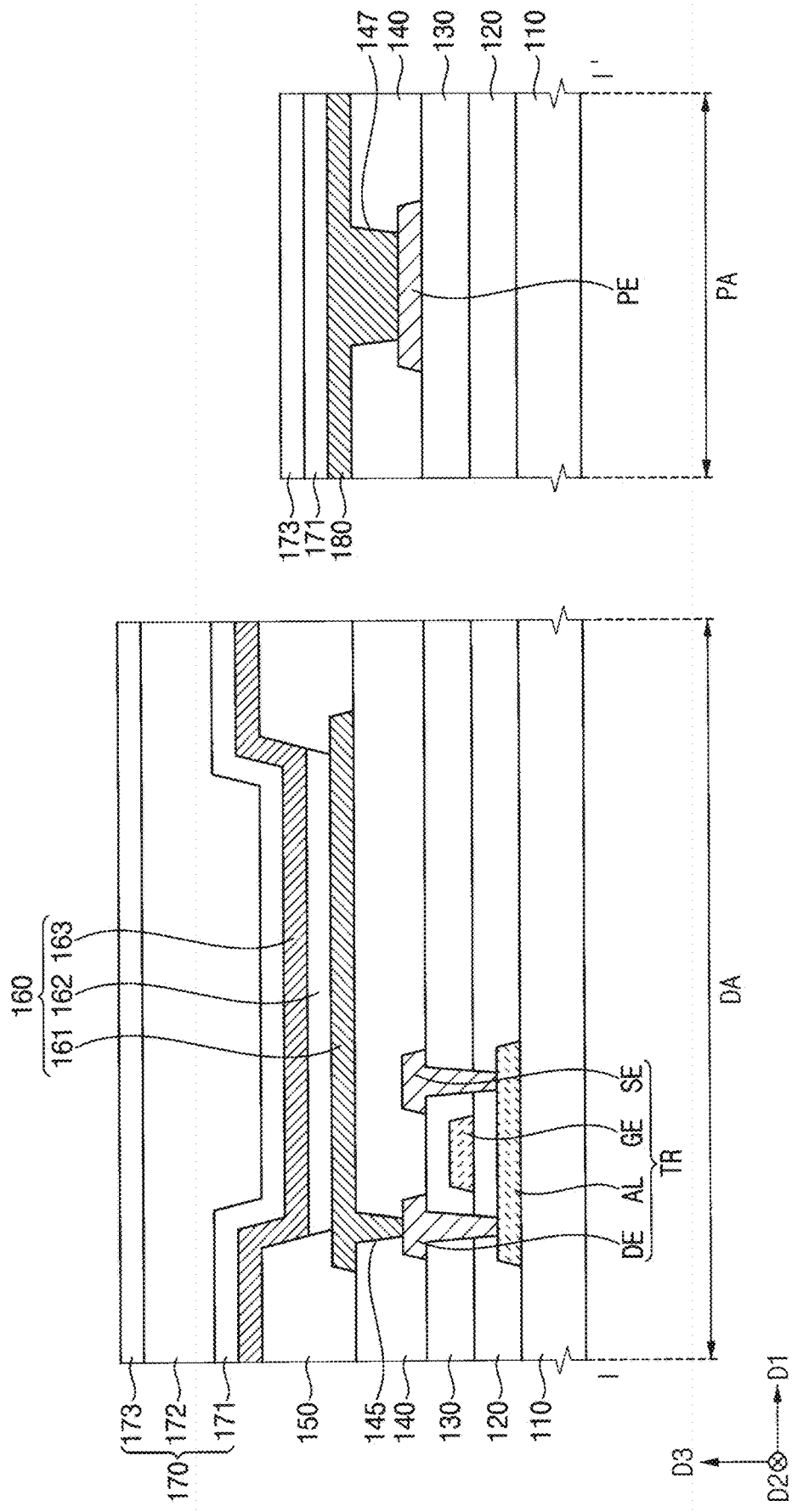

Referring to FIG. 9, the encapsulation layer 170 may be formed on the counter electrode 163. For example, the first inorganic encapsulation layer 171, the organic encapsulation layer 172, and the second inorganic encapsulation layer 173 may be sequentially formed. For example, the encapsulation layer 170 may be formed to cover the light emitting element 160 in the display area DA, and may prevent the light emitting element 160 from being damaged or degraded by external impurities.

The first inorganic encapsulation layer 171 may be formed over the whole of the display area DA and the pad area PA on the counter electrode 163 and the conductive layer 180. The organic encapsulation layer 172 may be formed in the display area DA on the first inorganic encapsulation layer 171. The second inorganic encapsulation layer 173 may be formed over the whole of the display area DA and the pad area PA on the first inorganic encapsulation layer 171 and the organic encapsulation layer 172. In other words, the first inorganic encapsulation layer 171 and the second inorganic encapsulation layer 173 may be sequentially formed in the pad area PA on the conductive layer 180. For example, the first inorganic encapsulation layer 171 and the second inorganic encapsulation layer 173 may be in direct contact with each other in the pad area PA on the conductive layer 180. The organic encapsulation layer 172 may be formed in the display area DA on the counter electrode 163, and interposed between the first inorganic encapsulation layer 171 and the second inorganic encapsulation layer 173 in the display area DA.

The first and second inorganic encapsulation layers 171 and 173 may be formed over the whole of the display area DA and the pad area PA on the protective insulating layer 140 and the conductive layer 180. For example, each of the first and second inorganic encapsulation layers 171 and 173 may be deposited over the whole substrate 110 without using a mask structure.

The first and second inorganic encapsulation layers 171 and 173 may be formed by using a material having an etching rate that is higher than an etching rate of the conductive layer 180 for the first etching process (e.g., the dry etching process using the plasma). In other words, in the first etching process shown in FIGS. 10 and 11, the first and second inorganic encapsulation layers 171 and 173 may be etched relatively more than the conductive layer 180. For example, the first and second inorganic encapsulation layers 171 and 173 may have good etch selectivity with respect to the conductive layer 180 for the first etching process. Thus, the conductive layer 180 may be hardly etched by the first etching process, while the parts of the first and second inorganic encapsulation layers 171 and 173 overlapping the pad electrode PE may be removed by the first etching process.

The first and second inorganic encapsulation layers 171 and 173 may be formed by using a material having an etching rate that is lower than the etching rate of the conductive layer 180 for the second etching process. In other words, in the second etching process shown in FIGS. 12 and 13, the conductive layer 180 may be etched relatively more than the first and second inorganic encapsulation layers 171 and 173. For example, the conductive layer 180 may have good etch selectivity with respect to the first and second inorganic encapsulation layers 171 and 173 for the second etching process. Thus, the first and second inorganic encapsulation layers 171 and 173 may be hardly etched by the second etching process, while the part of the conductive layer 180 overlapping the pad electrode PE may be removed by the second etching process. For example, the second etching process may be the wet etching process using the etchant. Therefore, through the second etching process, the conductive layer 180 may have the undercut (UC) shape in association with the ends of the first and second inorganic encapsulation layers 171 and 173 in the first direction D1.

Referring to FIGS. 10 and 11, parts of the first and second inorganic encapsulation layers 171 and 173 overlapping at least a part of the pad electrode PE may be removed through the first etching process. Through the first etching process, each of the first and second inorganic encapsulation layers 171 and 173 may be spaced apart from at least a part of the pad electrode PE when viewed in a plan view. That is, each of the first and second inorganic encapsulation layers 171 and 173 may expose all or a part of the pad electrode PE when viewed in a plan view. In other words, all or a part of the pad electrode PE may not overlap each of the first and second inorganic encapsulation layers 171 and 173 when viewed in a plan view. In an embodiment of the present invention, through the first etching process, each of the first and second inorganic encapsulation layers 171 and 173 may expose all of the second contact hole 147 in a plan view.

In an embodiment of the present invention, the first etching process may be performed without using a mask structure. For example, the first etching process may be a dry etching process using atmospheric-pressure plasma. In the dry etching process using the atmospheric-pressure plasma, an etching gas may be selectively provided to a partial region on the substrate. Therefore, when compared to a general dry etching process, the dry etching process using the atmospheric-pressure plasma may selectively etch the partial region on the substrate even without using a mask structure. For example, the first etching process may be performed in such a way as to provide the etching gas from a region overlapping the pad electrode PE to an end of the substrate 110 in the first direction D1. In the plan view of the display device 10 shown in FIG. 1, the end of the substrate 110 in the first direction D1 described here is the bottom side of the display device 10 in the pad area PA. In other words, the etching gas may be provided only to a region overlapping the pad electrode PE (e.g., a region indicated by an arrow of FIG. 10) from the end of the substrate 110 in the first direction D1. Accordingly, the parts of the first and second inorganic encapsulation layers 171 and 173 overlapping the pad electrode PE may be removed through the first etching process without using a mask structure. In an embodiment of the present invention, the etching gas may be selectively provided by an atmospheric-pressure plasma jet to an area from the region overlapping the pad electrode PE to the end of the substrate 110 in the first direction D1. The atmospheric-pressure plasma jet may generate high-density plasma without a vacuum system and may be localized in the processing area without a mask. In an embodiment of the present invention, the atmospheric-pressure plasma jet may scan from a region at the end of the substrate 110 in the pad area PA to a region overlapping the pad electrode PE (e.g., a region indicated by an arrow of FIG. 10) in the first direction D1 to locally provide the etching gas onto the first and second inorganic encapsulation layers 171 and 173 to locally remove the first and second inorganic encapsulation layers 171 and 173. However, the present invention is not limited thereto. For example, any suitable method capable of selectively providing atmospheric-pressure plasma to the local region to remove the parts of the first and second inorganic encapsulation layers 171 and 173 overlapping the pad electrode PE may be used.

The conductive layer 180 may have a first etching rate for the first etching process. The first and second inorganic encapsulation layers 171 and 173 may have a second etching rate, which is higher than the first etching rate, for the first etching process. For example, the etching gas may include a fluorine compound including fluorine (F). For example, the conductive layer 180 may have a multilayer structure, for example, a tri-layer structure of ITO/Ag/ITO, in which indium tin oxide (ITO), silver (Ag), and indium tin oxide (ITO) are sequentially stacked. Since the indium tin oxide (ITO) included in an uppermost layer of the conductive layer 180 has a relatively low etching rate for the fluorine compound, the conductive layer 180 may be hardly etched by the first etching process. Accordingly, when the parts of the first and second inorganic encapsulation layers 171 and 173 are removed by the first etching process, the conductive layer 180 may cover the pad electrode PE and the protective insulating layer 140 so that the pad electrode PE and the protective insulating layer 140 may not be exposed to the etching gas. For example, the conductive layer 180 may not be etched by the first etching process, so that the pad electrode PE and the protective insulating layer 140 may remain being covered by the conductive layer 180 during and after the first etching process. Therefore, the damage to the pad electrode PE and the protective insulating layer 140 caused by the first etching process may be prevented or reduced.

Referring to FIGS. 12 and 13, a part of the conductive layer 180 overlapping at least a part of the pad electrode PE may be removed through the second etching process. For example, a part of the conductive layer 180 not covered by the first and second inorganic encapsulation layers 171 and 173 may be removed through the second etching process. For example, through the second etching process, the conductive layer 180 may not make direct contact with the pad electrode PE. For example, through the second etching process, the conductive layer 180 may be spaced apart from at least a part of the pad electrode PE when viewed in a plan view. That is, the conductive layer 180 may expose all or a part of the pad electrode PE when viewed in a plan view. In other words, all or a part of the pad electrode PE may not overlap the conductive layer 180 when viewed in a plan view. For example, the conductive layer 180 inside the second contact hole 147 may be completely removed by the second etching process to expose the pad electrode PE. Thus, a conductive member may be formed to make direct contact with the top surface of the pad electrode PE exposed by the second contact hole 147, so that the pad electrode PE and the external device 20 may be electrically connected to each other through the conductive member.

The second etching process may be the wet etching process using the etchant. For example, the second etching process may be performed without using a mask structure. The conductive layer 180 may have a third etching rate for the second etching process. The pad electrode PE may have a fourth etching rate, which is lower than the third etching rate, for the second etching process. The protective insulating layer 140 may have a fifth etching rate, which is lower than the third etching rate, for the second etching process. The first and second inorganic encapsulation layers 171 and 173 may have a sixth etching rate, which is lower than the third etching rate, for the second etching process. For example, the conductive layer 180 may have a multilayer structure, for example, a tri-layer structure of ITO/Ag/ITO, in which indium tin oxide (ITO), silver (Ag), and indium tin oxide (ITO) are sequentially stacked. The pad electrode PE may have a multilayer structure, for example, a tri-layer structure of Ti/Al/Ti, in which titanium (Ti), aluminum (Al), and titanium (Ti) are sequentially stacked. Each of the titanium (Ti) included in an uppermost layer of the pad electrode PE and the protective insulating layer 140 may have a relatively low etching rate for the etchant as compared with the indium tin oxide (ITO) and the silver (Ag). Therefore, the pad electrode PE and the protective insulating layer 140 may be hardly etched by the second etching process. In addition, the first and second inorganic encapsulation layers 171 and 173 may have a relatively low etching rate for the etchant as compared with the indium tin oxide (ITO) and the silver (Ag). Therefore, the first and second inorganic encapsulation layers 171 and 173 may be hardly etched by the second etching process. Accordingly, the conductive layer 180 may have the undercut (UC) shape in association with the ends of the first and second inorganic encapsulation layers 171 and 173 in the first direction D1. Since the second etching process is a wet etching process, the conductive layer 180 may be isotropically etched, and may be recessed in the first direction D1 under the first and second inorganic encapsulation layers 171 and 173 to form the undercut (UC) shape by the wet etching process. Although the conductive layer 180 shows a straight sidewall at the undercut (UC) shape as shown in FIG. 13, the present invention is not limited thereto. For example, in an embodiment of the present invention, the undercut (UC) shape may have a convex shape toward the conductive layer 180 in the first direction.

In a conventional method of manufacturing a display device, to deposit an inorganic encapsulation layer such that the inorganic encapsulation layer does not overlap a pad electrode, a deposition process using a mask structure is required, and as a result, a process cost may increase. Meanwhile, the inorganic encapsulation layer may be deposited over the whole of a display area and a pad area without using a mask structure, and a part of the inorganic encapsulation layer overlapping the pad electrode may be removed by a dry etching process that does not use a mask structure. For example, an etching gas may be provided only to a partial region on a substrate (e.g., a region overlapping the pad electrode) to etch the part of the inorganic encapsulation layer. However, when the part of the inorganic encapsulation layer is etched, the pad electrode and a protective insulating layer located around the pad electrode may be damaged by the etching gas. That is, with a conventional structure configuration for manufacturing a display device, the pad electrode and the protective insulating layer are not protected from being damaged under a maskless etching process. Therefore, a contact failure in which the pad electrode and an external device are not electrically connected to each other may occur.

In an embodiment of the present invention, the method of manufacturing the display device 10 may be configured such that the conductive layer 180 is formed in the pad area PA on the pad electrode PE and the protective insulating layer 140. The conductive layer 180 may cover the top surface of the pad electrode PE exposed by the second contact hole 147 and a part of the protective insulating layer 140 located in the pad area PA. Further, the conductive layer 180 may be formed simultaneously with the pixel electrode 161 formed in the display area DA on the protective insulating layer 140. In other words, no additional step is required to form the conductive layer 180. In addition, the first and second inorganic encapsulation layers 171 and 173 may be deposited over the whole of the display area DA and the pad area PA without using a mask structure. Subsequently, the parts of the first and second inorganic encapsulation layers 171 and 173 overlapping the pad electrode PE may be removed by the first etching process. For example, the first etching process may be performed in such a way as to provide the etching gas only to a partial region on the substrate 110 (e.g., an arrow region of FIG. 10) without using a mask structure. For example, the first etching process may be a dry etching process using atmospheric-pressure plasma. Since the conductive layer 180 has a relatively low etching rate for the first etching process, the conductive layer 180 may be hardly etched by the first etching process. Therefore, the conductive layer 180 may prevent the pad electrode PE and the protective insulating layer 140 from being damaged by the first etching process. After the first etching process is performed, the part of the conductive layer 180 overlapping the pad electrode PE may be removed by the second etching process. For example, the second etching process may be a wet etching process. Each of the pad electrode PE and the protective insulating layer 140 may have a relatively low etching rate for the second etching process. Therefore, while the pad electrode PE and the protective insulating layer 140 are hardly etched by the second etching process, the part of the conductive layer 180 overlapping the pad electrode PE may be etched and removed. Accordingly, the number of mask structures used in the process of manufacturing the display device 10 may be reduced, so that the process cost may be reduced. In addition, a contact failure in which the pad electrode PE of the display device 10 and the external device 20 are not electrically connected to each other may be prevented, so that reliability of the display device 10 may be enhanced.

Although certain embodiments and implementations have been described herein, other embodiments and modifications will be apparent from this description. Accordingly, the present invention is not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:
    preparing a substrate including a display area and a pad area located on one side of the display area;
    forming a pad electrode in the pad area on the substrate;
    forming a protective insulating layer on the substrate and the pad electrode;
    forming a contact hole, which exposes at least a part of a top surface of the pad electrode, in the protective insulating layer;
    forming a conductive layer, which covers the contact hole, in the pad area on the pad electrode and the protective insulating layer;
    forming an inorganic encapsulation layer on the protective insulating layer and the conductive layer;
    removing a part of the inorganic encapsulation layer overlapping at least a part of the pad electrode through a first etching process; and
    removing a part of the conductive layer overlapping at least a part of the pad electrode through a second etching process.

2. The method of claim 1, wherein the conductive layer is formed to cover a part of the protective insulating layer located in the pad area.

3. The method of claim 1, wherein during the forming of the inorganic encapsulation layer on the protective insulating layer and the conductive layer, the inorganic encapsulation layer is formed over a whole of the display area and the pad area on the protective insulating layer and the conductive layer.

4. The method of claim 1, wherein the first etching process is performed without using a mask structure.

5. The method of claim 1, wherein the first etching process includes a dry etching process, and
    the second etching process includes a wet etching process.

6. The method of claim 1, wherein the conductive layer has a first etching rate for the first etching process, and
    the inorganic encapsulation layer has a second etching rate, which is higher than the first etching rate, for the first etching process.

7. The method of claim 1, wherein the conductive layer has a third etching rate for the second etching process, and
    the pad electrode has a fourth etching rate, which is lower than the third etching rate, for the second etching process.

8. The method of claim 7, wherein the protective insulating layer has a fifth etching rate, which is lower than the third etching rate, for the second etching process.

9. The method of claim 7, wherein the inorganic encapsulation layer has a sixth etching rate, which is lower than the third etching rate, for the second etching process.

10. The method of claim 1, further comprising:
    forming a transistor in the display area on the substrate before the protective insulating layer is formed; and
    forming a pixel electrode on the transistor and electrically connected to the transistor after the protective insulating layer is formed,
    wherein the pixel electrode is formed in a process the same as that of the conductive layer.

11. A method of manufacturing a display device, the method comprising:
    preparing a substrate including a display area and a pad area located on one side of the display area;
    forming a transistor in the display area on the substrate, and a pad electrode in the pad area on the substrate;

forming a protective insulating layer on the transistor and the pad electrode;

forming a first contact hole, which exposes at least a part of a top surface of a drain electrode of the transistor, and a second contact hole, which exposes at least a part of a top surface of the pad electrode, in the protective insulating layer;

forming a pixel electrode on the transistor and connected to the transistor through the first contact hole in the display area, and a conductive layer, which covers the second contact hole, in the pad area on the pad electrode and the protective insulating layer;

forming a light emitting element including the pixel electrode, a light emitting layer and a counter electrode sequentially stacked in the display area;

forming an inorganic encapsulation layer on the light emitting element and the conductive layer;

removing a part of the inorganic encapsulation layer overlapping at least a part of the pad electrode with a dry etching process using atmospheric-pressure plasma by selectively providing an etching gas to the part of the inorganic encapsulation layer to be removed without a mask; and removing a part of the conductive layer overlapping at least a part of the pad electrode through a wet etching process to form an undercut shape under the inorganic encapsulation layer.

* * * * *